(12) United States Patent
Okita et al.

(10) Patent No.: US 12,500,076 B2
(45) Date of Patent: Dec. 16, 2025

(54) CLEANING METHOD OF ELECTRONIC COMPONENT AND MANUFACTURING METHOD OF ELEMENT CHIP

(71) Applicant: Panasonic Intellectual Property Management Co., Ltd., Osaka (JP)

(72) Inventors: Shogo Okita, Hyogo (JP); Akihiro Itou, Kyoto (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 68 days.

(21) Appl. No.: 17/905,100

(22) PCT Filed: Dec. 4, 2020

(86) PCT No.: PCT/JP2020/045286
§ 371 (c)(1),
(2) Date: Aug. 26, 2022

(87) PCT Pub. No.: WO2021/181768
PCT Pub. Date: Sep. 16, 2021

(65) Prior Publication Data
US 2023/0102635 A1 Mar. 30, 2023

(30) Foreign Application Priority Data
Mar. 10, 2020 (JP) ................................. 2020-041310
Mar. 10, 2020 (JP) ................................. 2020-041312

(51) Int. Cl.
*H01L 21/02* (2006.01)
*H01L 21/027* (2006.01)
*H01L 21/3065* (2006.01)

(52) U.S. Cl.
CPC .... *H01L 21/0206* (2013.01); *H01L 21/02274* (2013.01); *H01L 21/0275* (2013.01); *H01L 21/30655* (2013.01)

(58) Field of Classification Search
CPC ........... H01L 21/0206; H01L 21/02274; H01L 21/0275; H01L 21/30655; H01L 21/67109;
(Continued)

(56) References Cited

U.S. PATENT DOCUMENTS 7,510,965 B2 * 3/2009 Ma .................... H01L 21/02063
438/667
9,076,860 B1 7/2015 Lei et al.
(Continued)

FOREIGN PATENT DOCUMENTS

CN 101095379 A 12/2007
CN 106449418 A 2/2017
(Continued)

OTHER PUBLICATIONS

Translation of DE 112015001462B4 (Year: 2015).*
(Continued)

*Primary Examiner* — Duy Vu N Deo
(74) *Attorney, Agent, or Firm* — MCDONALD HOPKINS LLC

(57) ABSTRACT

An electronic component cleaning method including: a preparation step of preparing an electronic component having a first surface covered with a protective film, a second surface opposite to the first surface, a sidewall between the first and second surfaces, and an adhering matter adhering to the sidewall; and a sidewall cleaning step of cleaning the sidewall. The sidewall cleaning step includes a deposition step of depositing a first film on the protective film and a surface of the adhering matter, using a first plasma, and a
(Continued)

removal step of removing the first film deposited on the surface of the adhering matter, together with at least part of the adhering matter, using a second plasma. In the sidewall cleaning step, the deposition step and the removal step are alternately repeated a plurality of times, so as to allow the protective film to continue to exist.

9 Claims, 24 Drawing Sheets

(58) Field of Classification Search
CPC ......... H01L 21/02057; H01L 21/02076; H01L 21/68742; H01L 21/78; H01J 37/32651; H01J 37/32724
USPC .................................................. 438/695–714
See application file for complete search history.

(56) References Cited

U.S. PATENT DOCUMENTS

| | | | |
|---|---|---|---|
| 2004/0018715 A1 | 1/2004 | Sun et al. | |
| 2006/0144817 A1 | 7/2006 | Balasubramaniam et al. | |
| 2009/0275202 A1 | 11/2009 | Tanaka et al. | |
| 2011/0207323 A1* | 8/2011 | Ditizio | H01L 21/02271 |
| | | | 257/E21.597 |
| 2014/0042583 A1 | 2/2014 | Iwasaki et al. | |
| 2014/0087562 A1 | 3/2014 | Ikarashi | |
| 2014/0332932 A1* | 11/2014 | Zhang | H10D 62/117 |
| | | | 438/700 |
| 2015/0318182 A1 | 11/2015 | Joseph et al. | |
| 2016/0233111 A1 | 8/2016 | Shiota et al. | |
| 2016/0336217 A1* | 11/2016 | Chang | H01L 21/02337 |
| 2017/0271165 A1* | 9/2017 | Kal | H01L 21/322 |
| 2017/0283949 A1* | 10/2017 | Yahata | C23C 16/45561 |
| 2018/0240678 A1 | 8/2018 | Itou et al. | |
| 2020/0251593 A1* | 8/2020 | Miao | H10D 30/62 |

FOREIGN PATENT DOCUMENTS

| | | |
|---|---|---|
| CN | 108305827 A | 7/2018 |
| JP | 2013-520830 A | 6/2013 |
| JP | 2014-036104 A | 2/2014 |
| JP | 2014-063866 A | 4/2014 |
| JP | 2014-513868 A | 6/2014 |
| JP | 2016-146395 A | 8/2016 |
| JP | 2018-137405 A | 8/2018 |
| WO | 2008/062600 A1 | 5/2008 |
| WO | 2012/023537 A1 | 2/2012 |
| WO | 2012/125560 A2 | 9/2012 |

OTHER PUBLICATIONS

PiCK plasma induced CO2 conversion (Year: 2020).*
International Search Report issued in Patent Application No. PCT/JP2020/045286 dated Feb. 16, 2021.
Chinese Office Action with its partical English translation dated Dec. 16, 2024 issued in the corresponding Chinese Patent Application No. 202080096277.2.
Japanese Office Action issued in Japanese Patent Application No. 2024-227875 dated Oct. 7, 2025.

* cited by examiner

CLEANING METHOD OF ELECTRONIC COMPONENT AND MANUFACTURING METHOD OF ELEMENT CHIP

TECHNICAL FIELD

The present invention relates to an electronic component cleaning method and an element chip manufacturing method.

BACKGROUND ART

As a dicing method for manufacturing element chips from a substrate, there have been proposed various methods, such as a blade dicing method using a blade, a laser dicing method and a stealth dicing method using a laser, and a plasma dicing method using a plasma. In particular, the plasma dicing method, which causes less mechanical damage on the substrate, has been developed as a processing method that suppresses the deterioration in the device characteristics (e.g., Patent Literatures 1 and 2). In the plasma dicing method, a technique called Bosch process is used in some cases.

CITATION LIST

Patent Literature

[PTL 1] Japanese Laid-Open Patent Publication No. 2014-513868
[PTL 2] Japanese Laid-Open Patent Publication No. 2016-146395

SUMMARY OF INVENTION

Technical Problem

In the Bosch process, with respect to streets (dicing regions) that define element regions of the substrate, an etching step using a fluorine-based gas plasma and a film deposition step using a fluorocarbon gas plasma are alternately repeated, so that grooves corresponding to the streets are formed and deepened. By this method, grooves having a high aspect ratio can be formed. However, a polymer mainly composed of fluorocarbon tends to adhere to an inner wall of the formed grooves, that is, a sidewall of the obtained element chips. Furthermore, fluorine atoms are contained in the polymer in some cases. With increase of the aspect ratio of the grooves, the above polymer is more likely to adhere.

The obtained element chips are picked up, and then subjected to a packaging process. When the polymer is adhering to the sidewall, the polymer may be peeled off at the time of picking-up to cause contamination, or the adhesion between the sealing resin and the element chip may deteriorate in the packaging process. Moreover, the fluorine atoms contained in the polymer have high mobility and can be a cause of deterioration in the reliability of the device.

One possible solution to reduce the adhering amount of the polymer is to optimize the conditions for the Bosch process. The optimum values of the conditions for the Bosch process differ depending on the size of the desired element chips, the width of the dicing regions, the depth of the grooves, and the like. It is therefore necessary to optimize the conditions for the Bosch process every time when the above numerical values are changed, tending to impair the productivity.

The above polymer can be removed also by an ashing treatment performed after the Bosch process. The ashing treatment is performed for removing a protective film (mask) which is provided on the surface of the element chips in order to protect the element regions. For the ashing treatment, usually, a plasma generated from oxygen gas is used. The surface of the element chips is easily exposed to plasma, while the sidewall thereof is hardly exposed to plasma. When the ashing treatment is performed to the extent that matters adhering to the sidewall is removed, the protective film may be excessively removed, and the element regions may be damaged.

Furthermore, the above polymer can be removed with a chemical solution. However, when using a chemical solution, the process management will be complicated, and moreover, the waste solution treatment is required, which adds cost. Under such circumstances, it is demanded to remove the polymer adhering to the sidewall of the element chips by a simple and convenient method with a wide process window.

Solution to Problem

One aspect of the present invention relates to an electronic component cleaning method, including: a preparation step of preparing an electronic component having a first surface covered with a protective film, a second surface opposite to the first surface, a sidewall between the first surface and the second surface, and an adhering matter adhering to the sidewall; and a sidewall cleaning step of cleaning the sidewall of the electronic component, wherein the sidewall cleaning step includes a deposition step of depositing a first film on a surface of the protective film and a surface of the adhering matter, using a first plasma, and a removal step of removing the first film deposited on the surface of the adhering matter, together with at least part of the adhering matter, using a second plasma, and in the sidewall cleaning step, the deposition step and the removal step are alternately repeated a plurality of times, so as to allow the protective film to continue to exist.

Another aspect of the present invention relates to an element chip manufacturing method, including: a substrate preparation step of preparing a substrate including a plurality of element regions and a dicing region defining the element regions, and having a first surface and a second surface opposite to the first surface; a protective film formation step of forming a protective film on the first surface; an aperture formation step of forming an aperture in the protective film, to expose the dicing region in the first surface; an etching step of repeating cycles, each cycle including a first step of forming a recessed portion corresponding to the exposed dicing region by plasma processing, and a second step of depositing a second film by plasma processing, on an inner wall of the recessed portion, to obtain an electronic component having the first surface covered with the protective film, the second surface, a sidewall between the first surface and the second surface, and an adhering matter adhering to the sidewall; and a sidewall cleaning step of cleaning the sidewall of the electronic component, wherein the sidewall cleaning step includes a deposition step of depositing a first film on a surface of the protective film and a surface of the adhering matter, using a first plasma, and a removal step of removing the first film deposited on the surface of the adhering matter, together with at least part of the adhering matter, using a second plasma, and in the sidewall cleaning step, the deposition step and the removal step are alternately repeated a plurality of times, so as to allow the protective film to continue to exist.

Another aspect of the present invention relates to an electronic component cleaning method, including: a preparation step of preparing an electronic component having a first surface covered with a protective film, a second surface opposite to the first surface, a sidewall between the first surface and the second surface, and an adhering matter adhering to the sidewall; and a sidewall cleaning step of cleaning the sidewall of the electronic component, wherein the sidewall cleaning step is performed by exposing the electronic component to a fourth plasma generated from a process gas including a carbon oxide gas.

Another aspect of the present invention relates to an element chip manufacturing method, including: a substrate preparation step of preparing a substrate including a plurality of element regions and a dicing region defining the element regions, and having a first surface and a second surface opposite to the first surface; a protective film formation step of forming a protective film on the first surface; an aperture formation step of forming an aperture in the protective film, to expose the dicing region in the first surface; an etching step of repeating cycles, each cycle including a first step of forming a recessed portion corresponding to the exposed dicing region by plasma processing, and a second step of depositing a second film by plasma processing, on an inner wall of the recessed portion, to obtain an electronic component having the first surface covered with the protective film, the second surface, a sidewall between the first surface and the second surface, and an adhering matter adhering to the sidewall; and a sidewall cleaning step of cleaning the sidewall of the electronic component, wherein the sidewall cleaning step is performed by exposing the electronic component to a fourth plasma generated from a process gas including a carbon oxide gas.

Advantageous Effects of Invention

According to the present invention, the sidewall can be cleaned while reducing the damage on the electronic component.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Embodiment 1

Figure 1:
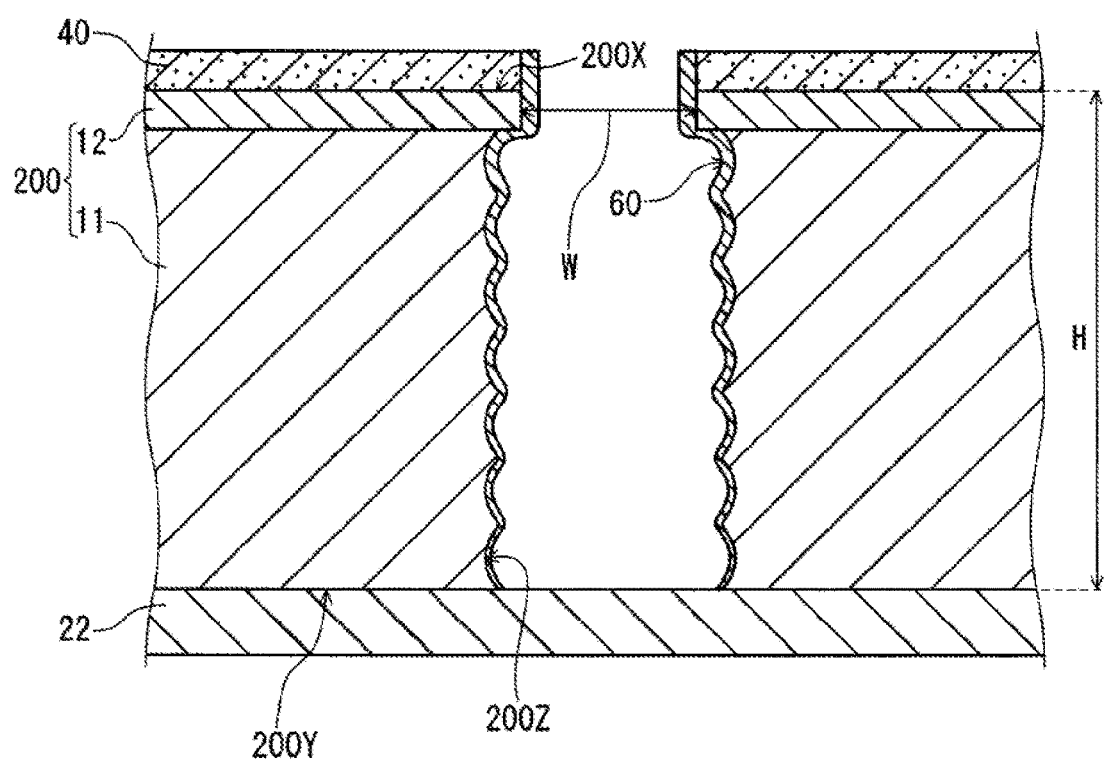
FIG. 1 A schematic cross-sectional view of an essential part of an electronic component subjected to a sidewall cleaning step according Embodiment 1 of the present invention.

Embodiment 1 of the present invention will be described. In the present embodiment, the sidewall of the electronic component is cleaned by utilizing the difference in the ease of plasma processability between the principal surface and the sidewall of the electronic component. This, as a result, can remove an adhering matter adhering to a sidewall, while allowing the protective film (mask) to continue to exist on the principal surface of the electronic component. In the sidewall cleaning step of the present embodiment, the following deposition step and removal step are repeated.

In the deposition step, using a first plasma, a first film is allowed to deposit on the protective film covering one principal surface (first surface) of the electronic component and the sidewall. The first film deposits thick on the surface of the protective film which is easily exposed to plasma. On the other hand, the first film deposits thinner on the sidewall than on the surface of the protective film. The first surface is protected with the protective film and the first film.

In the removal step, using a second plasma, the first film deposited on the surface of the adhering matter is removed, together with at least part of the adhering matter. As described above, the first film is deposited thinner on the sidewall. Therefore, as the first film is removed in the removal step, the adhering matter on the sidewall is also removed. On the other hand, the first film is deposited thick on the first surface. Therefore, the protective film is not etched in the removal step or, if etched, the amount thereof is small.

By repeating the above deposition and removal steps, the deposition and removal of the first film are repeated on the first surface. In other words, even when the deposition step and the removal step are repeated, the protective film itself is unlikely to be etched. Therefore, the damage on the first surface by the cleaning step is suppressed. On the other hand, on the surface of the sidewall, the deposition and removal of the first film are repeated, and the adhering matter is also removed when the first film is removed. In this way, the sidewall is cleaned. The deposition and removal steps may be repeated any number of times, and can be repeated until the adhering matter on the sidewall is removed. This is because the protective film itself is unlikely to be etched as described above.

The cleaning method according to the present embodiment is particularly suitable for cleaning the sidewall of an electronic component having been subjected to the Bosch process. The Bosch process alternates between a first step of forming a recessed portion corresponding to a dicing region by plasma processing, and a second step of depositing a second film by plasma processing on the inner wall of the recessed portion. Therefore, a deposited film, and a product of reaction between the deposited film and the plasma and the like (adhering matter) tend to adhere to a sidewall of the formed element chips. Moreover, roughness called scallops is formed on the sidewall. The adhering matter on the scallops is difficult to remove. According to the cleaning method according to the present embodiment, such adhering matter can be removed by a simple and convenient method. The present embodiment encompasses an element chip manufacturing method including an etching step using the Bosch process.

The sidewall cleaning step will be described in detail below.

The sidewall cleaning step includes a deposition step and a removal step. In the sidewall cleaning step, the deposition step and the removal step are alternately repeated a plurality of times.

(a) Deposition Step

On a sidewall of the electronic component, for example, an adhering matter including a film deposited by the Bosch process (deposited film) and a product of reaction between the deposited film and the plasma is adhering. Such an adhering matter is manly composed of a polymer (fluorocarbon) containing carbon atoms and fluorine atoms, and further contains silicon and oxygen. In the present step, a first film is further deposited on the surfaces of the protective film and the adhering matter (i.e., the sidewall).

For the deposition of the first film, for example, a first plasma generated from a first process gas containing carbon atoms (C) is used. With the gas containing carbon atoms, the first film is efficiently allowed to deposit on the surfaces of the protective film and the sidewall. Examples of the gas containing carbon atoms include: a fluorocarbon gas, such as $C_4F_8$ and $C_5F_8$, and a fluorohydrocarbon gas, such as $CHF_3$ and $CH_2F_2$.

The first process gas may include another gas, such as Ar, $CH_4$, $H_2$, and $N_2$. The proportion of the gas containing carbon atoms occupying the first process gas may be 10 vol % or more and less than 100 vol %, and may be 30 vol % or more and 98 vol % or less.

The first film deposited on the surface of the protective film may have any thickness. The thickness of the first film deposited on the surface of the protective film can be set as appropriated depending on the conditions of the removal step, the productivity, and the like. The thickness of the first film deposited on the surface of the protective film may be 3 nm or more and 660 nm or less, and may be 50 nm or more and 300 nm or less. The first film having such a thickness can be formed at a deposition rate of 200 nm/min or more and 2000 nm/min or less for a deposition time of 1 second or more and 20 seconds or less.

The first film deposited on the surface of the sidewall is preferably not excessively thick. A ratio D2/D1 of a thickness D2 of the first film deposited on the surface of the sidewall to a thickness D1 of the first film deposited on the surface of the protective film is preferably 4/10 or less, more preferably 3/10 or less. The D2/D1 is preferably 1/100 or more, more preferably 1/50 or more. The thickness D2 is an average of thicknesses measured at any five points of the first film deposited on the surface of the sidewall. Usually, the first film deposited on the surface of the sidewall is thicker, as nearer to the first surface.

The conditions for generating the first plasma are set as appropriate depending on the thickness, components, and the like of the first film. The first plasma is desirably generated under such conditions that allow the first film to deposit in a sufficient thickness on the surface of the protective film but does not allow it to deposit too thick on the surface of the sidewall. In this case, the adhering matter can be removed with a small number of cycles, and the productivity can be improved.

The deposition rate at which the first film is allowed to deposit on the surface of the protective film in the deposition step is referred to as a rate RD1. The deposition rate at which the first film is allowed to deposit on the surface of the sidewall in the deposition step is referred to as a rate RD2. In view of the foregoing, a ratio: RD2/RD1 of the rate RD2 to the rate RD1 is preferably 4/10 or less, more preferably 3/10 or less. The RD2/RD1 is preferably 1/100 or more, more preferably 1/50 or more.

The deposition rate of the first film can be controlled by, for example, in a plasma processing apparatus used of the sidewall cleaning step, adjusting the high-frequency power applied to a first electrode disposed facing a stage on which the electronic component is placed, the high-frequency power applied to a second electrode incorporated in the stage, the pressure in the processing chamber, the flow rate of gas, the temperature of the electronic component, and the like. Applying a high-frequency power to the second electrode generates a bias voltage applied to the stage. In the deposition step, the high-frequency power applied to the second electrode is desirably as low as possible, and may be 0 W. This can slow the deposition rate RD2 of the first film on the surface of the sidewall.

In order to deposit the first film in a sufficient thickness on the surface of the protective film, while avoiding excessive deposition of the first film on the surface of the sidewall, for example, the pressure in a processing chamber may be increased. In particular, increasing the pressure in the chamber while increasing the absolute value of the deposition rate of the first film is effective. In this case, the difference between the amount of the first film allowed to deposit per unit time on the surface of the protective film and that on the surface of the sidewall increases, and the RD2/RD1 tends to be small.

In order to increase the pressure in the chamber, for example, the gas flow rate may be increased. In order to increase the absolute value of the deposition rate of the first film, for example, the following measures can be taken: increasing the gas flow rate, increasing the high-frequency power applied to the first electrode, and decreasing the temperature of the electronic component. For the gas flow rate, however, an upper limit (threshold value) is set according to the power value of the high-frequency power applied to the first electrode. Therefore, with the gas flow rate set in the vicinity of this upper limit, by adjusting the gas exhaust rate, the pressure in the processing chamber and the absolute value of the deposition rate of the first film can be both increased. Two or more of the above measures may be combined. For example, while increasing the gas flow rate, the electronic component may be cooled down, and further, the high-frequency power applied to the first electrode may be increased. In the deposition step, the processing chamber is preferably set at a pressure of 10 Pa or more. The electronic component can be cooled down by, for example, vacuum-chucking the electronic component strongly to the cooled stage.

The conditions for generating the first plasma are, for example, as follows. $C_4F_8$ is supplied as a process gas at 100 sccm or more and 600 sccm or less into the processing (vacuum) chamber. The pressure in the vacuum chamber is 10 Pa or more and 40 Pa or less. A high-frequency power PD1 is 1000 W or more and 4800 W or less, and a high-frequency power PD2 is 0 W or more and 100 W or less. The stage temperature is −15° C. or higher and 15° C. or lower. According to the above conditions, the deposition rate becomes about 100 nm/min or more and about 2500 nm/min or less. The processing time can be determined depending on the thickness of the first film to be deposited on the surface of the protective film. The processing time is, for example, 1 second or more and 10 seconds or less.

(b) Removal Step

In the present step, at least part of the adhering matter adhering to the sidewall of the electronic component is removed with a second plasma. The adhering matter is removed together with the first film. At this time, the first film covering the surface of the protective film may also be removed. Note that, however, the first film on the protective film is thick, and the protective film is unlikely to be damaged.

For the removal of the adhering matter and/or the first film (hereinafter sometimes collectively referred to as the adhering matter etc.), for example, a second plasma generated from a second process gas containing oxygen atoms is used. With the second plasma derived from a gas containing oxygen atoms, the adhering matter etc. mainly composed of an organic material can be efficiently removed. Examples of the gas containing oxygen atoms include $O_2$, $CO_2$, and CO.

The second process gas may include another gas, for example, a fluorine-containing gas. By doing this, the removal effect of the adhering matter etc. can be enhanced. Examples of the fluorine-containing gas include a fluorocarbon gas, such as $CF_4$ and $C_4F_8$, a fluorohydrocarbon gas, such as $CHF_3$, and $SF_6$. The proportion of the gas containing oxygen atoms occupying the second process gas may be 10 vol % or more and less than 100 vol %, and may be 30 vol % or more and 98 vol % or less.

The conditions for generating the second plasma are set as appropriate depending on the amount, components, and the like of the adhering matter etc. Desirably, the second plasma is generated under such conditions that can avoid excessive removal of the first film on the protective film. In this case, the protective film is unlikely to be damaged, and the first surface can be protected.

The removal rate at which the first film on the surface of the protective film is removed in the removal step is referred to as a rate RR1. The removal rate at which the first film on the surface of the sidewall is removed in the removal step is referred to as a rate RR2. In view of the above, a ratio: RR2/RR1 of the rate RR2 to the rate RR1 is preferably, for example, 3/10 or more and 10/10 or less.

The removal rate of the first film on the surface of the sidewall can be controlled by, for example, adjusting the high-frequency power applied to the first electrode, the high-frequency power applied to the second electrode, the pressure in the processing chamber, the flow rate of gas, the temperature of the stage, and the like.

In order to avoid excessive removal of the first film on the protective film, as in the deposition step, for example, the pressure in the processing chamber may be increased. In particular, increasing the pressure in the processing chamber while increasing the absolute value of the removal rate of the first film is effective. In order to increase the absolute value of the removal rate of the first film, for example, the gas rate may be increased, the high-frequency power applied to the first electrode may be increased, or the temperature of the electronic component may be increased. Two or more of the above measures may be combined. For example, while increasing the gas flow rate, the temperature of the electronic component may be increased, and furthermore, the high-frequency power applied to the first electrode may be increased. In order to increase the temperature of the electronic component, the vacuum chucking force to the stage of the electronic component may be reduced. The vacuum chucking force to the stage of the electronic component can be controlled by the voltage value applied to a later-described ESC electrode. In the removal step, the pressure in the processing chamber is preferably 20 Pa or more, more preferably 30 Pa or more.

The conditions for generating the second plasma are, for example, as follows. A mixed gas of $O_2$ and $CF_4$ (ratio of flow rate $CF_4/O_2$=0% to 10%) is supplied as a process gas at 50 sccm or more and 600 sccm or less into the vacuum chamber. The pressure in the vacuum chamber is 10 Pa or more and 60 Pa or less. A high-frequency power PR1 is 1000 W or more and 4800 W or less, and a high-frequency power PR2 is 0 W or more and 100 W or less. The stage temperature is −15° C. or higher and 15° C. or lower. According to the above conditions, the removal rate becomes about 200 nm/min or more and about 3000 nm/min or less. The processing time may be set as appropriate so that the first film having deposited on the surface of the protective film in the deposition step can be removed. The processing time is, for example, 0.1 seconds or more and 200 seconds or less, and preferably 6 seconds or more and 15 seconds or less.

The deposition step and the removal step are alternately repeated a plurality of times. Each time the removal step is performed, the amount of the adhering matter on the sidewall decreases. On the other hand, the thickness of the protective film is maintained. The deposition steps may be performed under the same or different conditions. For example, the processing time in the deposition step may be shortened gradually. Likewise, the removal steps may be performed under the same or different conditions. For example, the processing time in the removal step may be prolonged gradually. Alternatively, in the removal step, the high-frequency power PR2 applied to the second electrode may be varied with time. The sidewall cleaning step may begin with the deposition step or the removal step. The sidewall cleaning step, however, preferably ends with the removal step.

The sidewall cleaning step is performed, as described above, by utilizing the difference in the ease of plasma processability between the principal surface and the sidewall of the electronic component. The sidewall cleaning step is preferably performed such that the ratio: RD2/RD1 of the rate RD2 to the rate RD1 in the deposition step and the ratio: RD2/RD1 of the rate RR2 to the rate RR1 in the removal step satisfies RD2/RD1<RR2/RR1. In other words, the sidewall cleaning step is preferably performed under such conditions that, in comparison with the first film on the protective film, the first film is difficult to deposit on the sidewall, while the first film on the sidewall is easy to remove. In this case, the cleaning of the sidewall can be performed more efficiently.

In order to satisfy the relationship RD2/RD1<RR2/RR1, for example, a pressure PD1 in the processing chamber in the deposition step and a pressure PR1 in the processing chamber in the removal step may be controlled so as to satisfy PD1<PR1.

Also, for example, a high-frequency power PD2 applied to the second electrode in the deposition step and a high-frequency power PD2 applied to the second electrode in the removal step may be controlled, so as to satisfy PD2≤PR2.

In the sidewall cleaning step, a plurality of the electronic components may be processed simultaneously. This can improve the productivity. In this case, a distance W between the sidewalls facing each other of any two adjacent electronic components and a height H of the sidewall of one of the two of the electronic components may satisfy H≥5W. Even with such high-aspect-ratio gaps, according to the present embodiment, the adhering matter adhering to the sidewall can be removed, with the protective film covering the principal surface of the electronic components allowed to continue to exist. The distance W and the height H may satisfy H≤50W.

The height H of the sidewall is not limited. The height H of the sidewall is, for example, 20 μm or more and 700 μm or less. The distance W between the sidewalls also is not limited. The distance W between the sidewalls is, for example, 4 μm or more and 60 μm or less.

The distance W is an average of the shortest distances measured at any two points between the first-surface-side ends of the sidewalls facing each other of any two adjacent electronic components. When the sidewalls are not entirely facing each other, the shortest distance is measured at the portions where the sidewalls face each other. The height H of the sidewall is the lower of two averages each determined by measuring the height at any two points of each of the two sidewalls (or the portions thereof) used for determining the distance W. The height of the sidewall is a shortest distance between the first and second surfaces continuing from the sidewall.

The present embodiment will be specifically described below with reference to the drawings, with an electronic component having a semiconductor layer and a wiring layer taken as an example. The present embodiment, however, is not limited thereto.

FIG. 1 is a schematic cross-sectional view of an essential part of the electronic components subject to the sidewall cleaning step. A plurality of electronic components 200 are supported by a holding sheet 22 described later. The holding sheet 22 is used for improving the ease of handling, and may not be necessarily used.

The electronic components 200 each include a semiconductor layer 11 and a wiring layer 12 disposed on the semiconductor layer 11 on a first surface 200X side. The first surface 200X is covered with a protective film 40. Scallops are formed on a sidewall 200Z of the electronic components 200. An adhering matter 60 is adhering to the sidewall 200Z. In the illustrated example, the scallops and the adhering matter are exaggerated.

Figure 2:
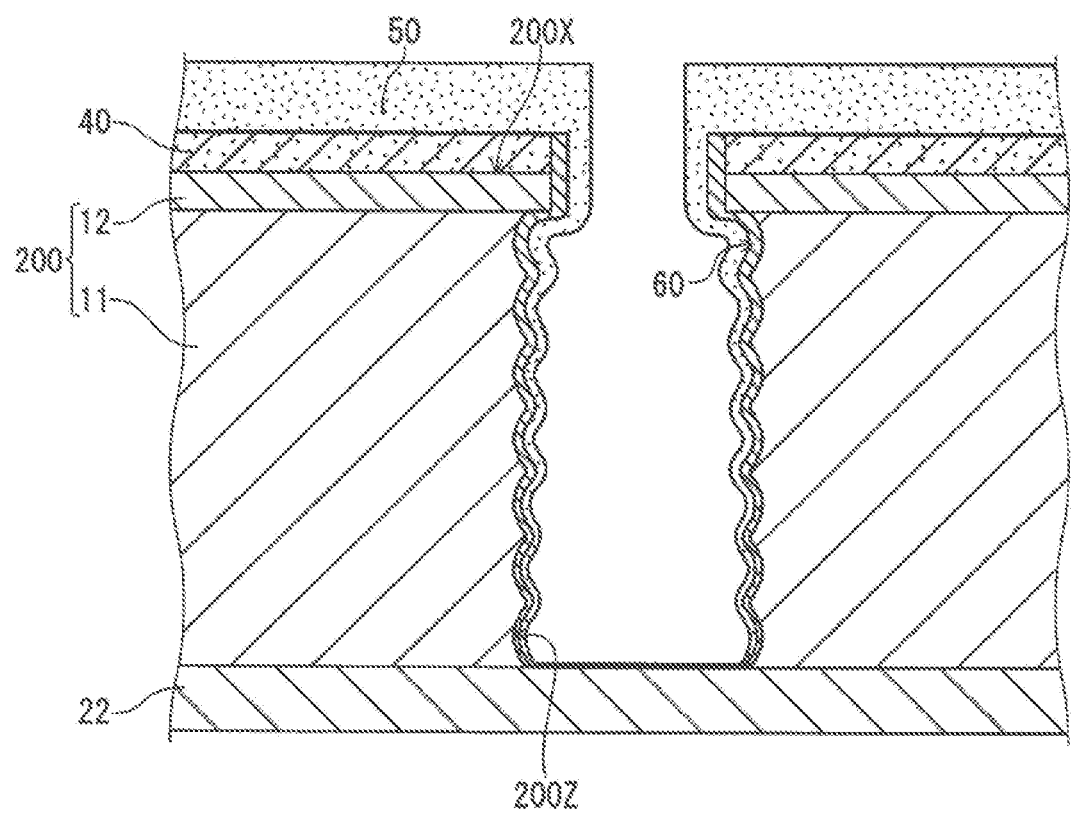
FIG. 2 A schematic cross-sectional view of an essential part of the electronic component after a deposition step in the 1st cycle according to Embodiment 1 of the present invention.

FIG. 2 is a schematic cross-sectional view of an essential part of the electronic components after the deposition step in the 1st cycle. A first film 50 is deposited on the surface of the protective film 40 and the surface of the sidewall 200Z. The first film 50 deposited on the surface of the sidewall 200Z is thinner than that on the protective film 40.

Figure 3:
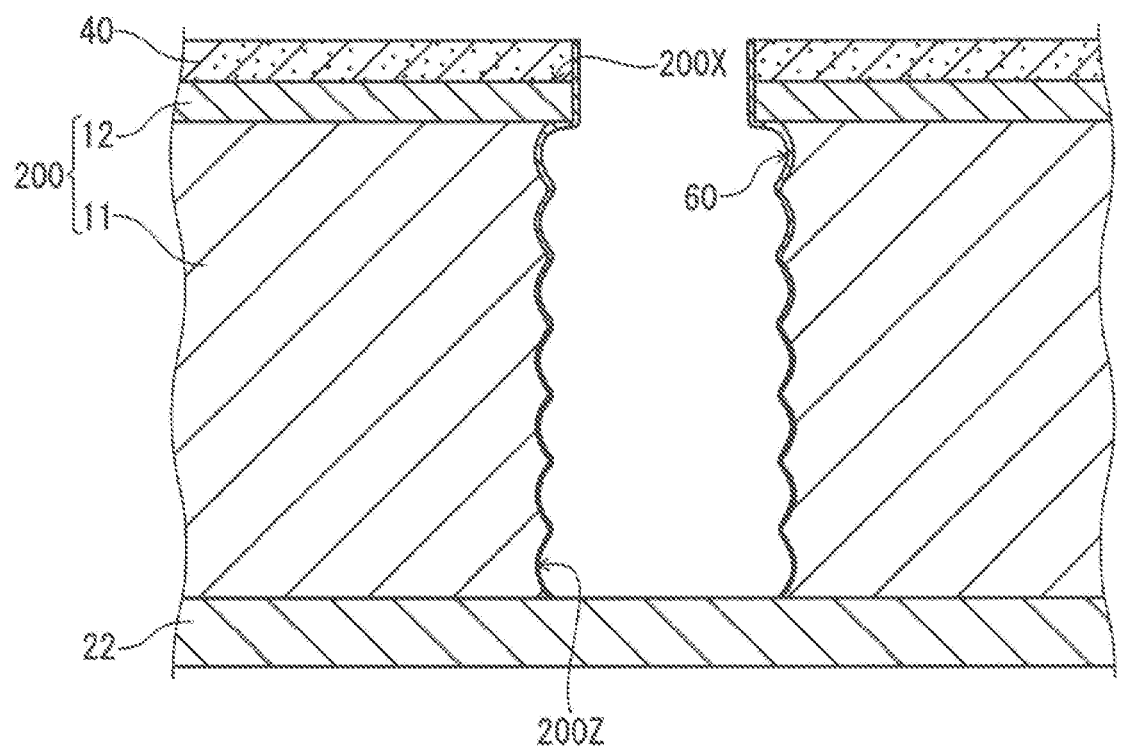
FIG. 3 A schematic cross-sectional view of an essential part of the electronic component after a removal step in the 1st cycle according to Embodiment 1 of the present invention.

FIG. 3 is a schematic cross-sectional view of an essential part of the electronic components after the removal step in the 1st cycle. The first film 50 deposited in the deposition step is removed. On the sidewall 200Z, the adhering matter 60 is partially removed together with the first film 50, and the layer of the adhering matter 60 is thinned.

Figure 4:
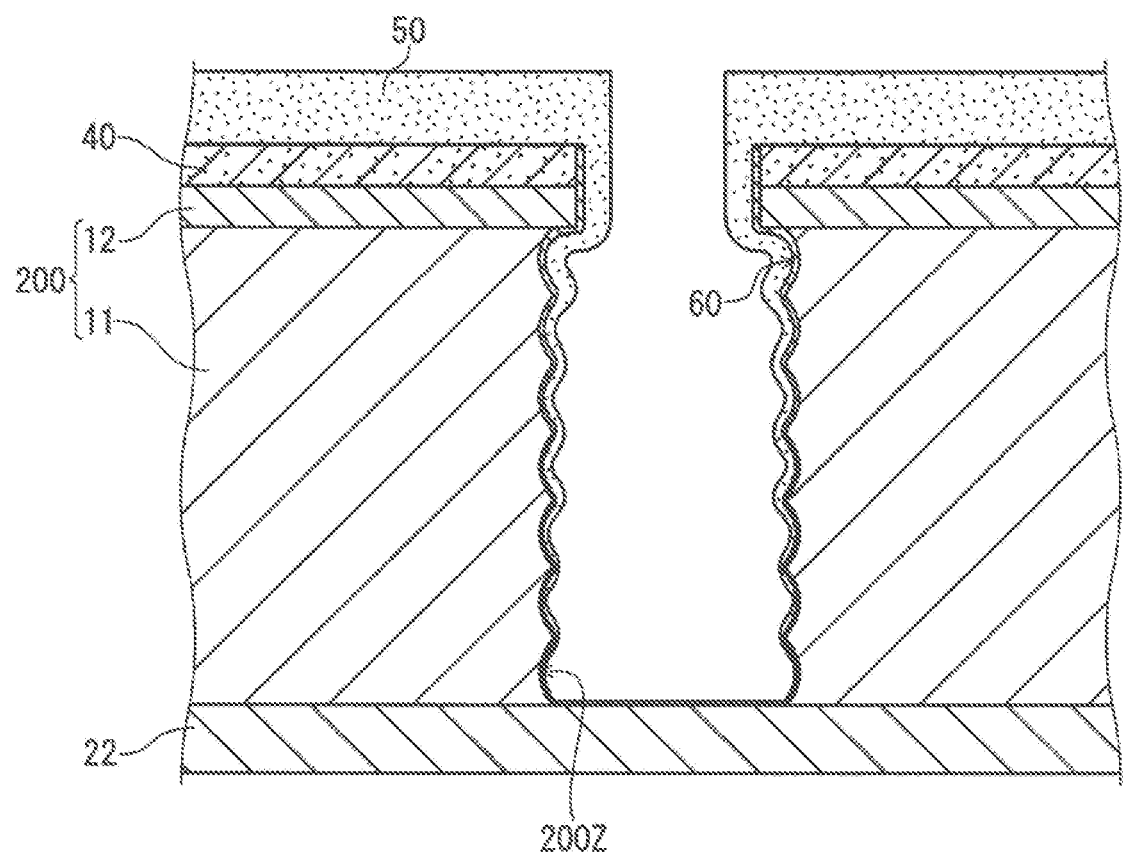
FIG. 4 A schematic cross-sectional view of an essential part of the electronic component after the deposition step in the Nth cycle (N≥2) according to Embodiment 1 of the present invention.

FIG. 4 is a schematic cross-sectional view of an essential part of the electronic components after the deposition step in the Nth cycle (N≥2). The first film 50 is deposited on the surface of the protective film 40 and the surface of the sidewall 200Z. The first film 50 deposited on the surface of the sidewall 200Z is thinner than that on the protective film 40.

Figure 5:
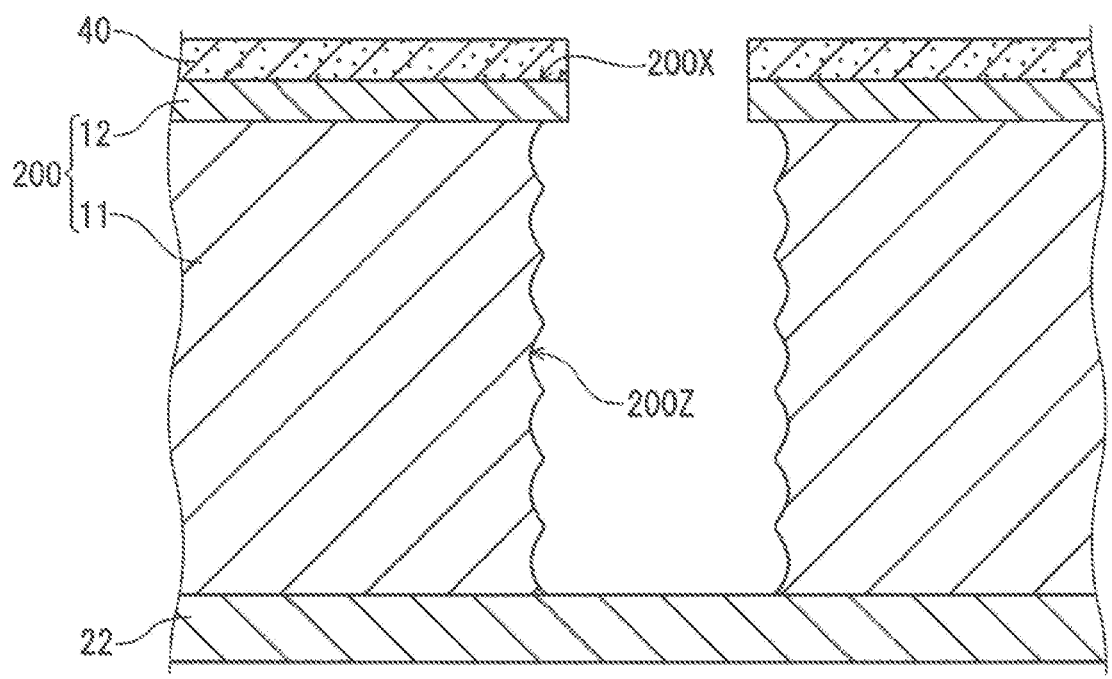
FIG. 5 A schematic cross-sectional view of an essential part of the electronic component after the removal step in the Nth cycle (N≥2) according to Embodiment 1 of the present invention.

FIG. 5 is a schematic cross-sectional view of an essential part of the electronic components after the removal step in the Nth cycle (N≥2). The first film 50 deposited in the deposition step in the Nth cycle (N≥2) is removed. On the sidewall 200Z, the residual portion of the adhering matter 60 is removed together with the first film 50, and the sidewall 200Z is exposed.

Next, a cleaning method including the above sidewall cleaning step will be described.

A. Electronic Component Cleaning Method

Figure 6:
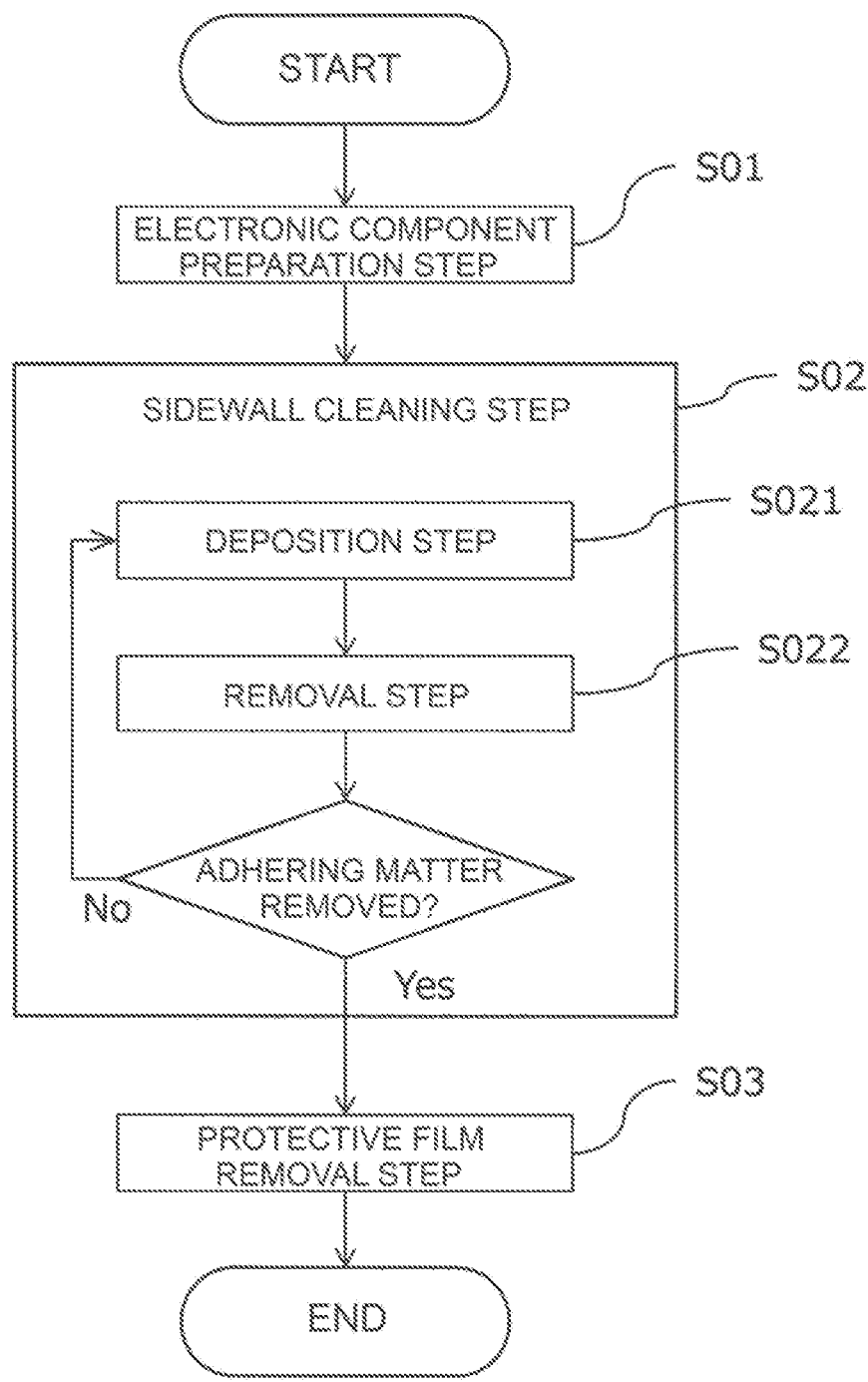
FIG. 6 A flowchart of an electronic component cleaning method according to Embodiment 1 of the present invention.

An electronic component cleaning method according to the present embodiment incudes: a preparation step of preparing an electronic component having a first surface covered with a protective film, a second surface opposite to the first surface, a sidewall between the first surface and the second surface, and an adhering matter adhering to the sidewall; and the above sidewall cleaning step of cleaning the sidewall of the electronic component. FIG. 6 is a flowchart of the electronic component cleaning method according to the present embodiment.

(i) Electronic Component Preparation Step (S01)

At least one electronic component having a first surface covered with a protective film, a second surface opposite to the first surface, and a sidewall between the first surface and the second surface is prepared. The electronic component is, for example, an element chip produced by plasma-dicing a substrate using the Bosch process. Scallops, or roughness, may be formed on the sidewall.

The electronic component includes, for example, a semiconductor layer and a wiring layer.

The semiconductor layer contains, for example, silicon (Si), gallium arsenide (GaAs), gallium nitride (GaN), silicon carbide (SiC), or the like. The semiconductor layer in the electronic component may have any thickness; the thickness may be, for example, 20 μm or more and 1000 μm or less, and may be 50 μm or more and 300 μm or less.

The wiring layer constitutes, for example, a semiconductor circuit, an electronic component element (e.g., LED, laser, MEMS), and may include an electrically insulating film, a metal material, a resin film (e.g., polyimide), a resist layer, an electrode pad, a bump, and others. The insulating film may be in the form of a laminate with a wiring metal material (e.g., multilevel wiring layer, redistribution layer).

The protective film includes a resist material, which is, for example, a thermosetting resin such as polyimide, a photoresist such as phenol resin, or a water-soluble resist such as acrylic resin. The protective film containing such a resist material is formed usually for protecting the electronic component during production and is removed before the electronic component is completed. The insulating film (e.g., silicon nitride, silicon oxide film) and/or the resin film (polyimide) disposed at the outermost layer of the electronic component can serve as the protective film. Such a protective film constituted of the insulating film is formed for protecting the electronic component during production as well as after distribution, and is not removed.

The protective film may have any thickness. When the protective film is formed of the aforementioned resist material, however, the protective film is preferably thick enough so as not to be completely removed by the etching step using the Bosch process. The thickness of the protective film can be set, for example, by calculating an amount (thickness) of the protective film to be etched in the above etching step, to be thicker than the calculated amount. The thickness of the protective film is, for example, 5 μm or more and 60 μm or less. When the protective film is the above insulating film and the like, the conditions for the Bosch process are adjusted such that the protective film is etched only by a few μm or less in the above etching step.

When a plurality of the electronic components are processed simultaneously in the sidewall cleaning step, for ease of handling, the electronic components are preferably attached to a holding sheet secured to a frame. A member including a frame and a holding sheet secured to the frame is referred to as a conveying carrier.

(Conveying Carrier)

The frame is a frame member having an opening large enough to surround a plurality of the electronic components. The frame has a predetermined width and a substantially constant thin thickness. The frame has such a rigidity that it can be conveyed with the holding sheet and the electronic components held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the electronic components thereto, the holding sheet preferably includes an adhesive layer and a non-adhesive layer with flexibility.

The non-adhesive layer may be made of any material, and may be a thermoplastic resin, which includes, for example: polyolefin, such as polyethylene and polypropylene; and polyester, such as polyvinyl chloride and polyethylene terephthalate. The resin material may be blended with a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The above thermoplastic resin may have a functional group that reacts during photopolymerization reaction, such as an acryl group. The non-adhesive layer may have any thickness; the thickness may be, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover the opening of the frame. On the adhesive side exposed from the opening of the frame, the electronic components are attached at its one principal surface (second surface), so that the electronic components are held on the holding sheet. The electronic components may be held on the holding sheet via a die attach film (DAF).

The adhesive layer is preferably made of an adhesive component, the adhesive strength of which is reduced by ultraviolet (UV) irradiation. In this case, when picking up the electronic components after the protective film removal step, the electronic components can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less (preferably, 5 μm or more and 15 μm or less).

The above electronic component preparation step includes: a substrate preparation step of preparing a substrate including a plurality of element regions and a dicing region defining the element regions, and having a first surface and a second surface opposite to the first surface; a protective film formation step of forming a protective film on the first surface; an aperture formation step of forming an aperture in the protective film, to expose the dicing region in the first surface; and an etching step of repeating cycles, each cycle including a first step of forming a recessed portion corresponding to the exposed dicing region by plasma processing, and a second step of depositing a second film by plasma processing, on an inner wall of the recessed portion. These steps will be described later. In this way, a plurality of electronic components arranged at predetermined intervals are prepared.

Figure 7A:
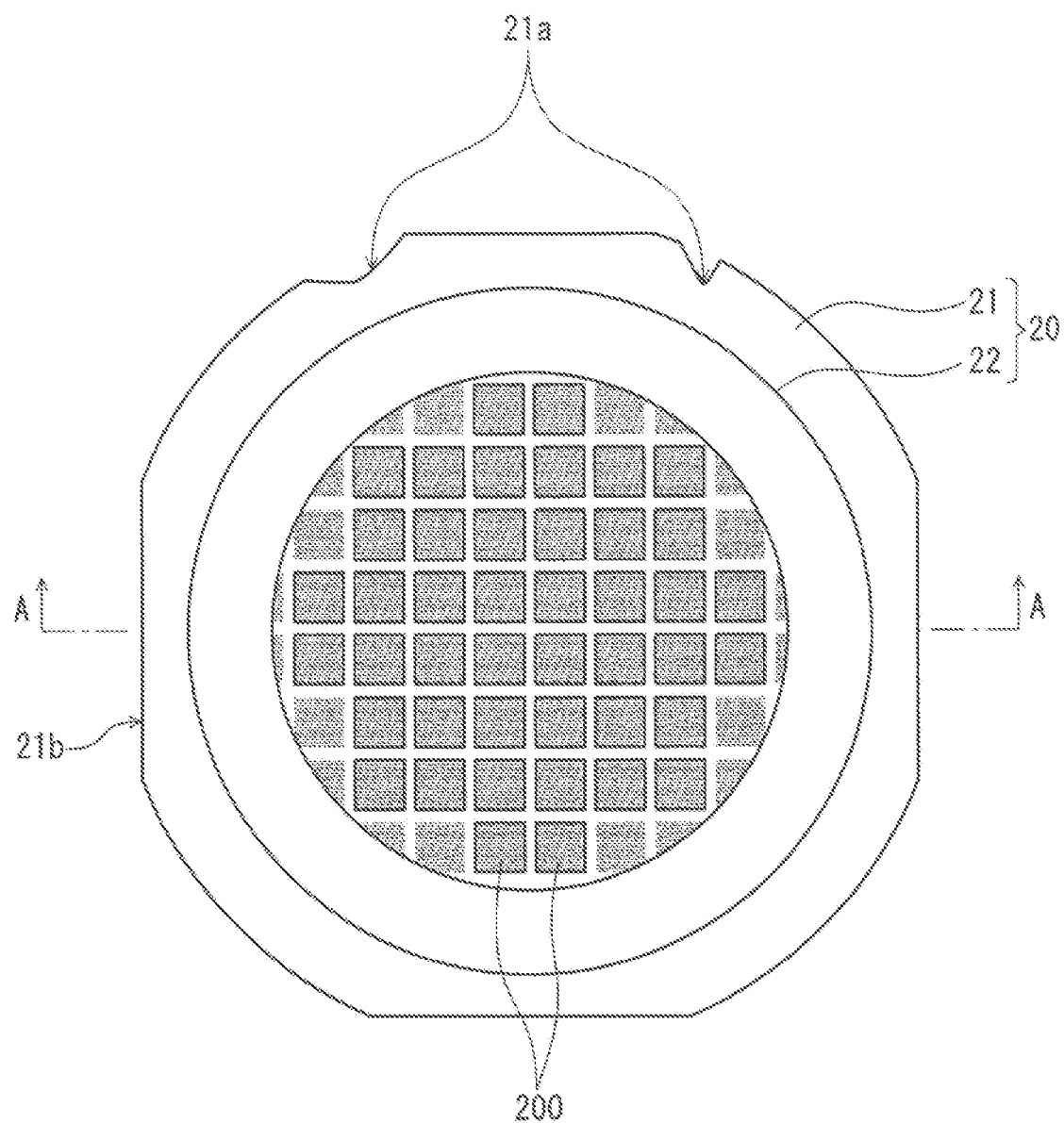
FIG. 7A A schematic top view of electronic components prepared in an electronic component preparing step according to Embodiments 1 and 2 of the present invention.
Figure 7B:
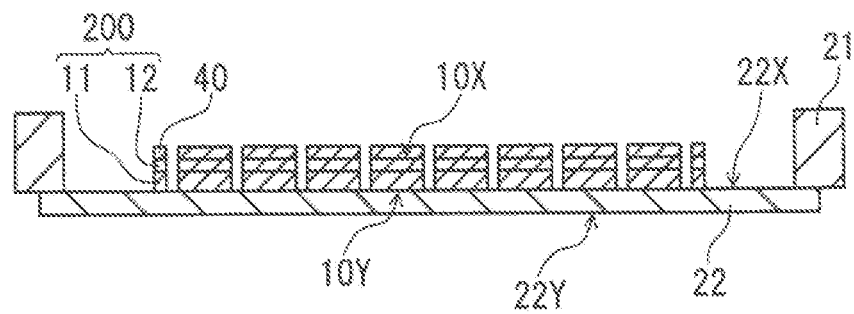
FIG. 7B A cross-sectional view taken along line A-A in FIG. 7A.

FIG. 7A is a schematic top view of electronic components prepared in an electronic component preparing step. FIG. 7B is a cross-sectional view taken along line A-A in FIG. 7A. In FIG. 7B, the adhering matter is not shown for illustrative convenience.

A conveying carrier 20 includes a frame 21 and a holding sheet 22 secured to the frame 21. The frame 21 may be provided with a notch 21a and a corner cut 21b for correct positioning. The holding sheet 22 has an adhesive side 22X and a non-adhesive side 22Y, and the adhesive side 22X is attached at its periphery to one side of the frame 21. On a portion of the adhesive side 22X exposed from the opening of the frame 21, second surfaces 200Y of the electronic components 200 are attached.

A plurality of the electronic components 200 are attached, with a space therebetween, onto the adhesive side 22X of the holding sheet 22. Such a plurality of the electronic components 200 can be obtained by plasma-dicing a substrate using the Bosch process. The electronic components 200 each include a semiconductor layer 11 and a wiring layer 12 disposed on the semiconductor layer 11 on a first surface 200X side. A protective film 40 is formed on the first surface 200X of the electronic components 200.

(ii) Sidewall Cleaning Step (S02)

The sidewall of the element chips is cleaned.

The sidewall cleaning step is implemented by the above (a) deposition step (S021) and (b) removal step (S022). According to the sidewall cleaning step, the adhering matter on a sidewall can be removed, with the protective film allowed to continue to exist. The deposition step and the removal step are repeated until the adhering matter is removed.

(iii) Protective Film Removal Step (S03)

After the removal step performed last, the protective film may be removed.

For the removal of the protective film, for example, a third plasma generated from a third process gas including oxygen gas ($O_2$) is used. The third process gas may include 02 and a fluorine-containing gas. Examples of the fluorine-containing gas include similar compounds to those as mentioned above. The proportion of $O_2$ occupying the third process gas may be 10 vol % or more and less than 100 vol %, and may be 30 vol % or more and 98 vol % or less.

The conditions for generating the third plasma may be set as appropriate depending on the amount, components, and the like of the protective film.

The conditions for generating the third plasma are, for example, as follows. A mixed gas of $CF_4$ and $O_2$ (ratio of flow rate $CF_4/O_2$=0% to 10%) is supplied as an ashing gas at 50 sccm or more and 600 sccm or less into the vacuum chamber. The vacuum chamber is set at a pressure of 1 Pa or more and 30 Pa or less. A high-frequency power PA1 of 1000 W or more and 4800 W or less is applied to the first electrode, and a high-frequency power PA2 of 0 W or more and 100 W or less is applied to the second electrode. The high-frequency power PA2 applied to the second electrode in the protective film removal step is desirably set smaller than the power applied to the second electrode in the etching step. The processing time is set as appropriate depending on the amount of the protective film, and is, for example, 3 seconds or more and 300 seconds or less.

When the protective film is water-soluble, the protective film may be removed by washing with water, instead of using the third plasma. When the protective film is an insulating film and/or a resin layer arranged on the outermost surface of the electronic component, the protective film may not be removed. This is because such a protective film is formed for protecting the electronic component during production as well as after distribution.

B. Element Chip Manufacturing Method

An element chip manufacturing method according to the present embodiment includes: a substrate preparation step of preparing a substrate including a plurality of element regions and a dicing region defining the element regions, and having a first surface and a second surface opposite to the first surface; a protective film formation step of forming a protective film on the first surface; an aperture formation step of forming an aperture in the protective film, to expose the dicing region in the first surface; an etching step of repeating cycles, each cycle including a first step of forming a recessed portion corresponding to the exposed dicing region by plasma processing, and a second step of depositing a second film by plasma processing, on an inner wall of the recessed portion, to obtain an electronic component having the first surface covered with the protective film, the second surface, a sidewall between the first surface and the second surface, and an adhering matter adhering to the sidewall; and a sidewall cleaning step of cleaning the sidewall of the electronic component.

Figure 8:
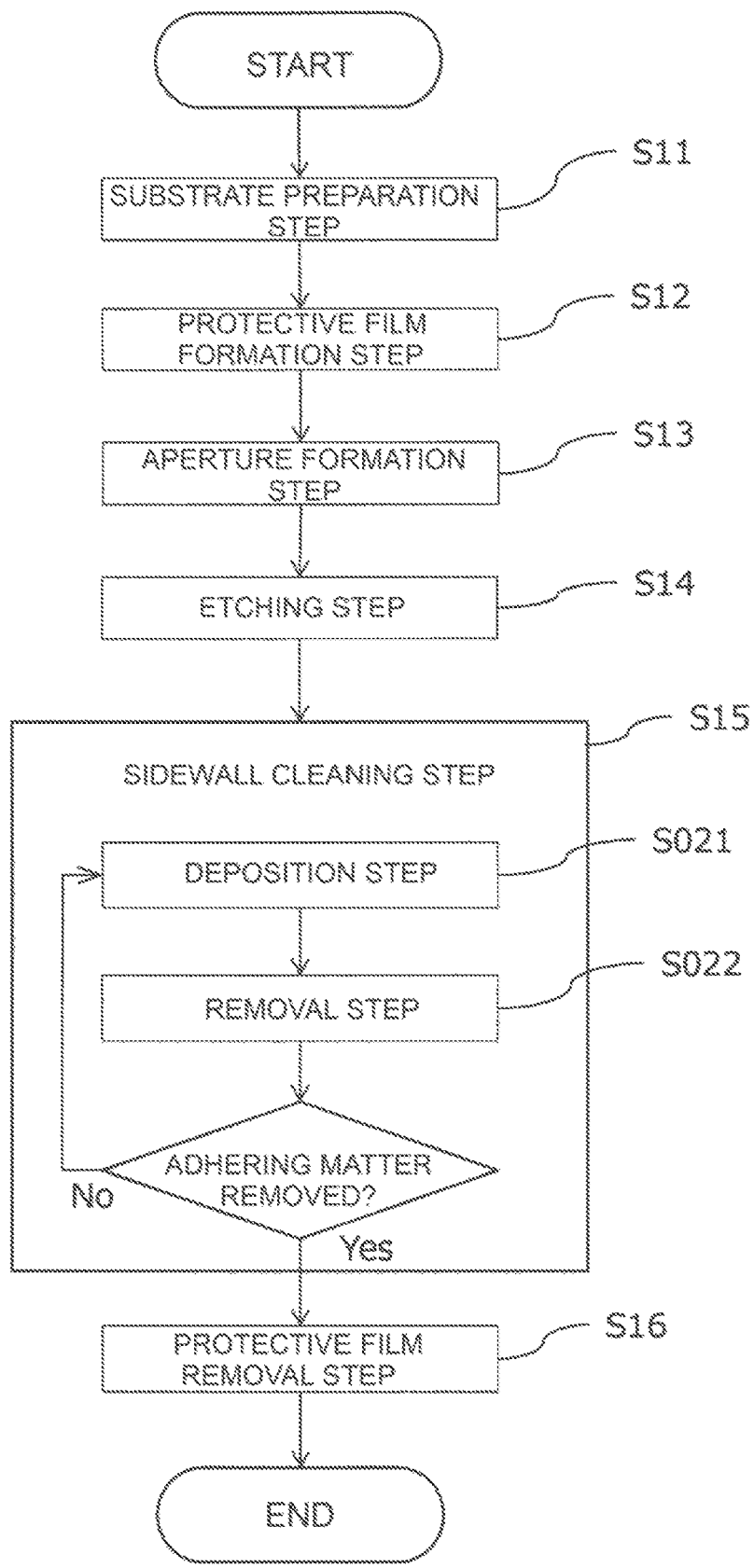
FIG. 8 A flowchart of an element chip manufacturing method according to Embodiment 1 of the present invention.

The sidewall cleaning step includes: a deposition step of depositing a first film on a surface of the protective film and a surface of the adhering matter, using a first plasma; and a removal step of removing the first film deposited on the surface of the adhering matter, together with at least part of the adhering matter, using a second plasma. The deposition step and the removal step are alternately repeated a plurality of times, so as to allow the protective film to continue to exist. FIG. 8 is a flowchart of the element chip manufacturing method according to the present embodiment.

(1) Substrate Preparation Step (S11)

First, a substrate, which is an object to be processed, is prepared.

(Substrate)

The substrate has a first surface and a second surface, and has a plurality of element regions and dicing regions defining the element regions. The substrate includes the above semiconductor layer. The element regions of the substrate may further include the aforementioned wiring layer. The dicing regions of the substrate may further include an electrically insulating film and a metal material, such as TEG (Test Element Group). Etching the substrate along the dicing regions can provide a plurality of element chips.

The substrate may be of any size, and is, for example, 50 mm or more and 300 mm or less in maximum diameter. The substrate may be of any shape, and is, for example, circular or rectangular. The substrate may be provided with a cut, such as an orientation flat or a notch.

The shape of the dicing regions may be set as appropriate depending on the desired shape of element chips, without limited to a straight linear shape, and may be, for example, a zig-zag shape or a wavy line shape. The shape of element chips is, for example, rectangular or hexagonal.

The width of the dicing regions may be set as appropriate depending on the size of the substrate or the element chips, and others. The width of the dicing regions is, for example, 10 μm or more and 300 μm or less. A plurality of the dicing regions may have the same width or different widths. The dicing region is typically formed in plural numbers on the substrate. The pitch between the dicing regions adjacent to each other also is not limited, and may be set as appropriate depending on the size of the substrate or the element chips, and others.

The second surface of the substrate may be attached to the holding sheet secured to the frame. This improves the ease of handling. By dicing the substrate attached to the holding sheet, a plurality of element chips arranged at intervals on the holding sheet can be obtained. The shapes, materials, etc. of the frame and holding sheet are as described above.

(2) Protective Film Formation Step (S12)

A protective film covering the first surface of the substrate is formed.

The protective film is provided for protecting the element regions of the substrate from plasma and the like. After the etching step, the protective film is removed. The material and thickness of the protective film are as described above.

The protective film can be formed by, for example, forming a resist material into a sheet and attaching the sheet to the substate, or by applying a liquid raw material of a resist material to the substrate using spin coating or spray coating technique. By changing the amount of the liquid raw material while applying, the thickness of the protective film can be partially changed. Spin coating and spray coating may be used in combination, by which the coating amount may be adjusted.

(3) Aperture Formation Step (S13)

Apertures are formed in the protective film, to expose the dicing regions of the substrate.

The apertures can be formed by, for example, removing regions corresponding to the dicing regions by photolithography, in the protective film formed of a photoresist. The apertures may be formed by removing regions corresponding to the dicing regions by laser-scribing patterning, in the protective film formed of a thermosetting resin or water-soluble resist.

The apertures may be formed by removing the protective film and the wiring layer in the dicing regions. The removal of the wiring layer in the dicing regions may be performed in the etching step as described later. In this case, a plasma for removing the protective film and a plasma for etching the substrate may be generated under different conditions.

(4) Etching Step (S14)

The substrate is exposed to a plasma, so that the dicing regions exposed from the apertures are etched to the second surface, thereby to form a plurality of element chips from the substrate. The element chips thus obtained are held by the holding sheet.

The etching step is performed by the Bosch process. In the Bosch process, a cycle including a first step of forming grooves corresponding to the dicing regions, and a second step of depositing a film on the inner wall of the grooves is performed once or more times. In addition, the above film (deposited film) removal step is performed between the first step and the second step.

In the 1st cycle, shallow recessed portions corresponding to the dicing regions are formed by the first step. Subsequently, a deposited film is formed on the inner wall of the shallow recessed portions by the second step. The 2nd cycle begins with the deposited film removal step. The deposited film removal step is implemented by anisotropic etching. Specifically, of the film deposited on the inner wall of the recessed portions, the film covering the bottom is removed. This is followed by the first step, by which the bottom of the recessed portions is etched isotropically. After the first step, the second step is performed again, by which a deposited film is formed on the inner wall of the recessed portions. By repeating the 2nd cycle (deposited film removal step, first step, and second step) in this way, at least one element chip having a first surface covered with the protective film, a second surface, and a sidewall can be obtained. On a sidewall of the element chip thus provided, an adhering matter including a deposited film and a product of reaction between the deposited film and the plasma is adhering. Scallops may be formed on the sidewall.

The processing conditions in the deposited film removal step are, for example, as follows. $SF_6$ and $O_2$ are supplied as process gases respectively at a rate of 200 sccm or more and 1000 sccm less and at a rate of 0 sccm or more and 20 sccm or less into the vacuum chamber. The vacuum chamber is set at a pressure of 5 Pa or more and 30 Pa or less. A high-frequency power of 1500 W or more and 4800 W or less is applied to the first electrode, and a high-frequency power of 50 W or more and 200 W or less is applied to the second electrode. The processing time is 1 second or more and 5 seconds or less.

The processing conditions in the first step are, for example, as follows. $SF_6$ and $O_2$ are supplied as process gases respectively at a rate of 200 sccm or more and 1000 sccm less and at a rate of 0 sccm or more and 20 sccm or less into the vacuum chamber. The vacuum chamber is set at a pressure of 5 Pa or more and 30 Pa or less. A high-frequency power of 1500 W or more and 4800 W or less is applied to the first electrode, and a high-frequency power of 0 W or more and 100 W or less is applied to the second electrode. The processing time is 3 seconds or more and 30 seconds or less.

The processing conditions in the second step are, for example, as follows. $C_4F_8$ is supplied as a process gas at a rate of 100 sccm or more and 600 sccm less into the vacuum chamber. The vacuum chamber is set at a pressure of 5 Pa or more and 30 Pa or less. A high-frequency power of 1500 W or more and 4800 W or less is applied to the first electrode, and a high-frequency power of 0 W or more and 100 W or less is applied to the second electrode. The processing time is 1 second or more and 10 seconds or less.

By repeating the second step, the deposited film removal step, and the first step under the conditions as above, the semiconductor layer containing Si can be etched vertically in the depth direction at a rate of 10 μm/min or more and 20 μm/min or less.

(5) Sidewall Cleaning Step (S15)

The sidewall of the obtained electronic components is cleaned.

The sidewall cleaning step is implemented by the sidewall cleaning step (ii) in the above electronic component cleaning method. According to the sidewall cleaning step of the present embodiment, the adhering matter on the sidewall can be removed, with the protective film allowed to continue to exist.

The etching step and the sidewall cleaning step may be performed in the same or different plasma processing apparatus. When performed in the same plasma processing apparatus, these steps may be performed successively.

(6) Protective Film Removal Step (S16)

The protective film removal step is implemented by the protective film removal step (iii) in the above electronic component cleaning method. By this step, the protective film is removed.

The sidewall cleaning step and the protective film removal step may be performed in the same or different plasma processing apparatus. When performed in the same plasma processing apparatus, these steps may be performed successively.

After the protective film removal step, the element chips are detached from the holding sheet.

The element chips are, for example, thrust upward together with the holding sheet with thrust-up pins from the non-adhesive side of the holding sheet. This allows at least part of the element chip to float from the holding sheet. The element chips are then detached from the holding sheet by a pickup device.

A detailed description will be given below of the element chip manufacturing method, with reference to the drawings. It is to be noted, however, the present embodiments are not limited thereto.

Figure 9:
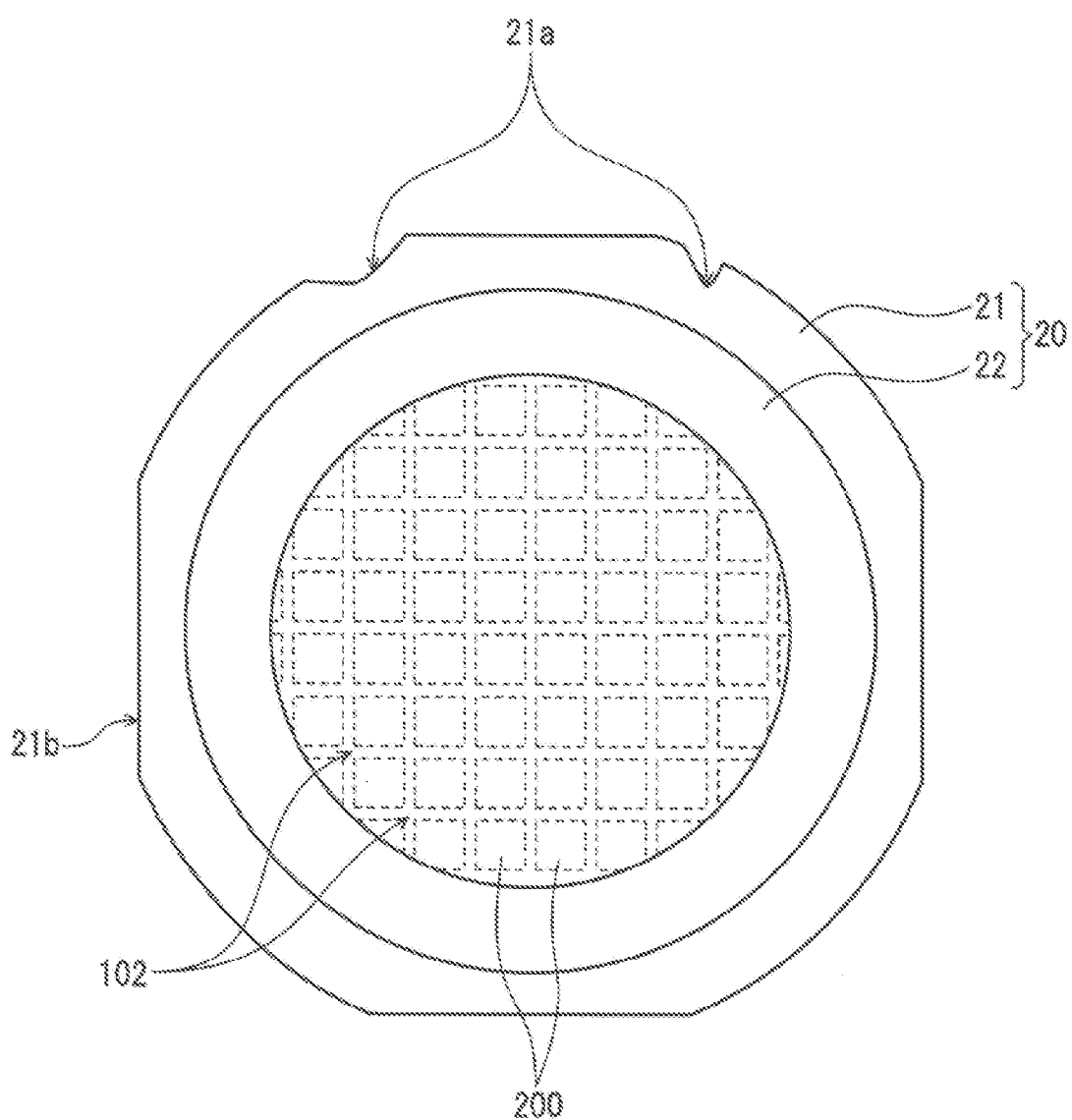
FIG. 9 A schematic top view of a substrate prepared in a substrate preparing step according to Embodiments 1 and 2 of the present invention.
Figure 10:
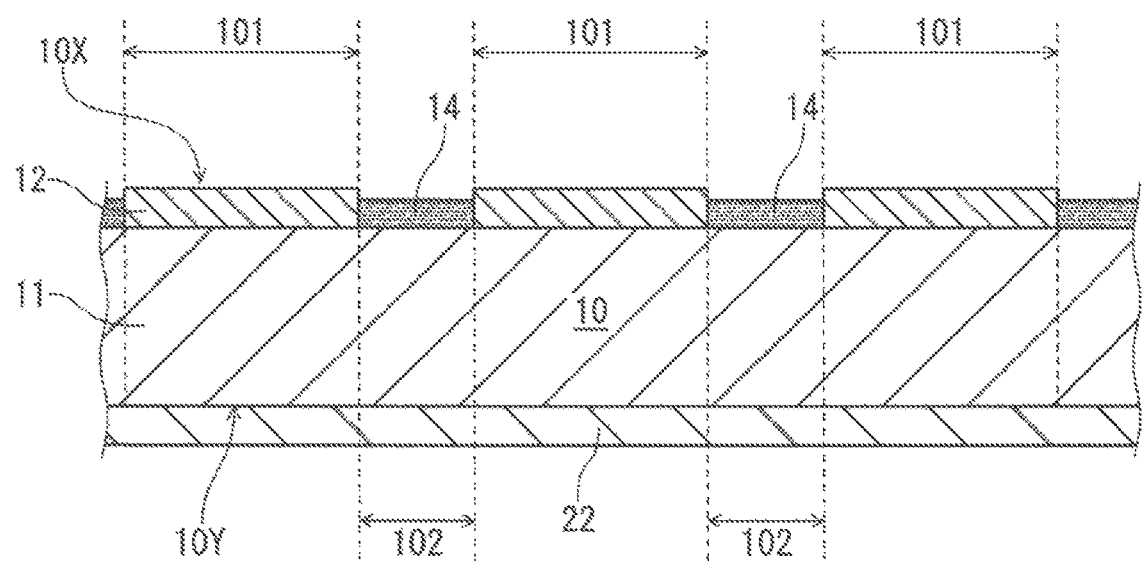
FIG. 10 A schematic partial cross-sectional view of the substrate prepared in the substrate preparing step according to Embodiments 1 and 2 of the present invention.

FIG. 9 is a schematic top view of a substrate prepared in the substrate preparing step according to the present embodiment. FIG. 10 is a schematic partial cross-sectional view of the substrate. A substrate 10 has a first surface 10X and a second surface 10Y, and includes a plurality of element regions 101 and dicing regions 102 defining the element regions 101. The element regions 101 each include a semiconductor layer 11 and a wiring layer 12 disposed on the semiconductor layer 11 on the first surface 10X side. The dicing regions 102 each include the semiconductor layer 11 and an insulating film 14. The second surface 10Y of the substrate 10 is attached to the holding sheet 22 included in the conveying carrier 20.

Figure 11:
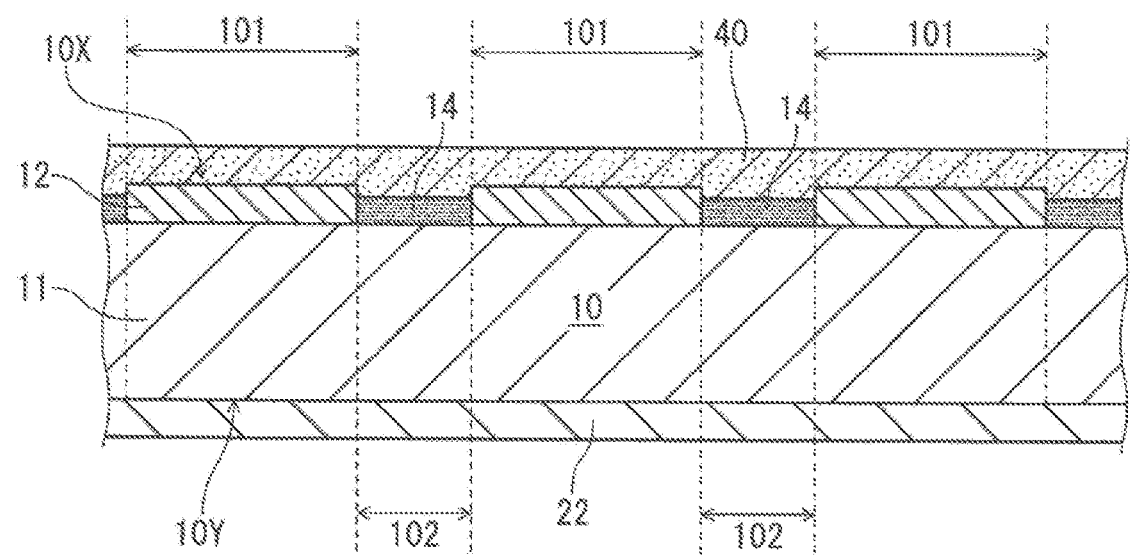
FIG. 11 A schematic partial cross-sectional view of the substrate after a protective film formation step according to Embodiments 1 and 2 of the present invention.

FIG. 11 is a schematic partial cross-sectional view of the substrate after the protective film formation step according to the present embodiment. The protective film 40 is formed on the first surface 10X of the substrate 10.

Figure 12:
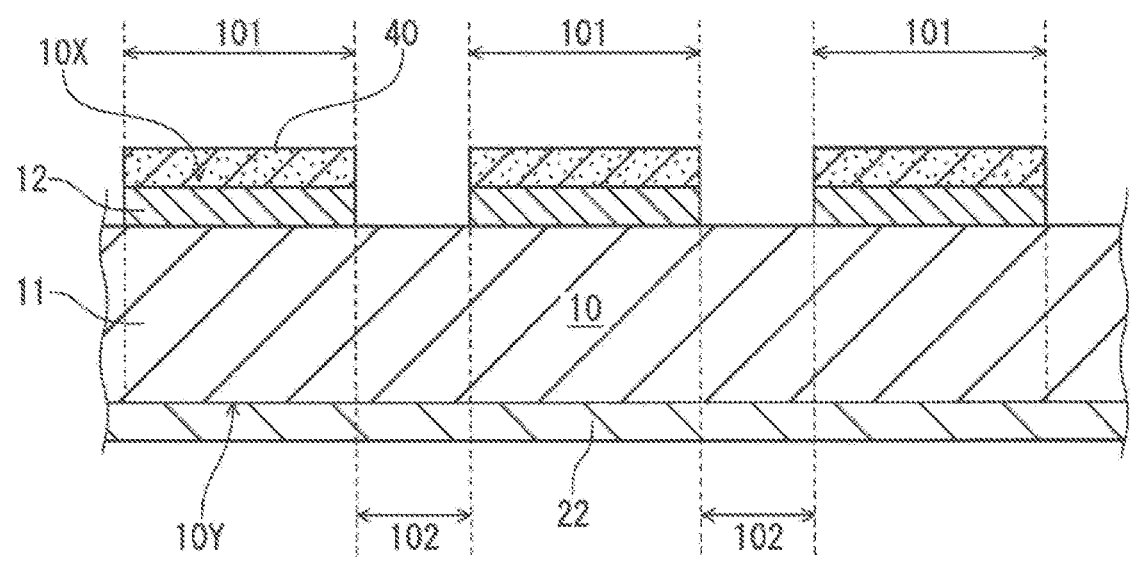
FIG. 12 A schematic partial cross-sectional view of the substrate after an aperture formation step according to Embodiments 1 and 2 of the present invention.

FIG. 12 is a schematic partial cross-sectional view of the substrate after the aperture formation step according to the present embodiment. The protective film 40 and the insulating film 14 in the dicing regions 102 are removed, and the semiconductor layer 11 is exposed from the apertures in the dicing regions 102.

Figure 13:
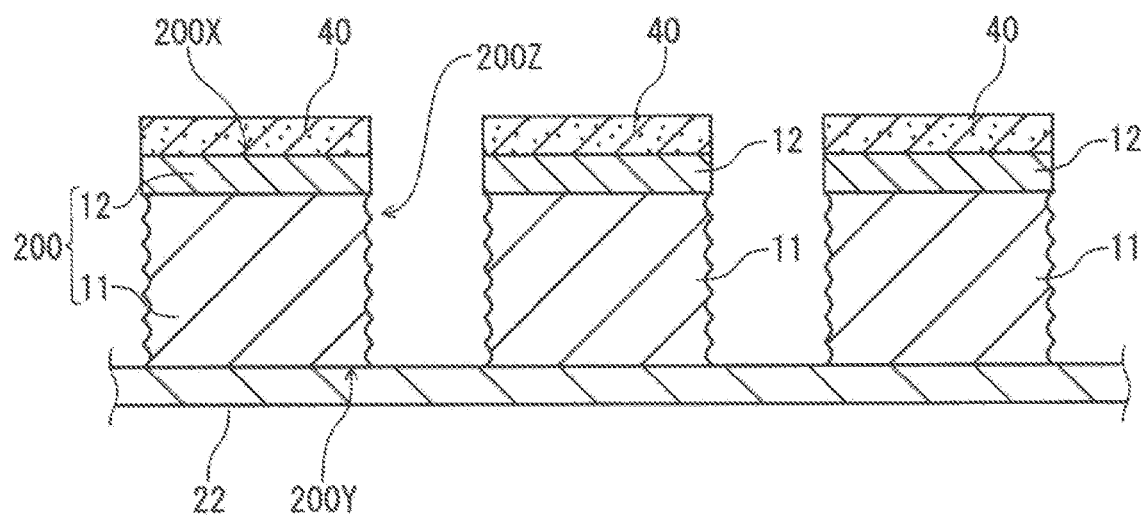
FIG. 13 A schematic partial cross-sectional view of element chips produced in an etching step according to Embodiments 1 and 2 of the present invention.

FIG. 13 is a schematic partial cross-sectional view of element chips produced in the etching step according to the present embodiment. The substrate is etched along the dicing regions, and a plurality of element chips 200 are formed from the substrate. Scallops are formed on a sidewall 200Z of the electronic components. The first surface 200X of the element chips 200 is covered with the protective film 40.

Figure 14:
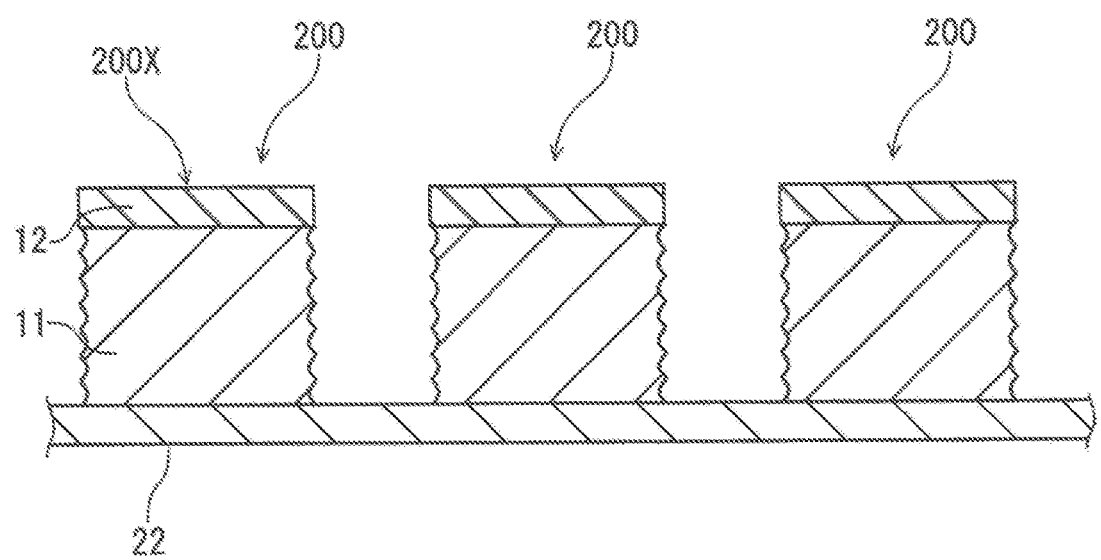
FIG. 14 A schematic partial cross-sectional view of the element chips after a protective film removal step according to Embodiments 1 and 2 of the present invention.

FIG. 14 is a schematic partial cross-sectional view of the element chips after the protective film removal step according to the present embodiment. The protective film 40 covering the first surface 200X is removed.

Figure 15:
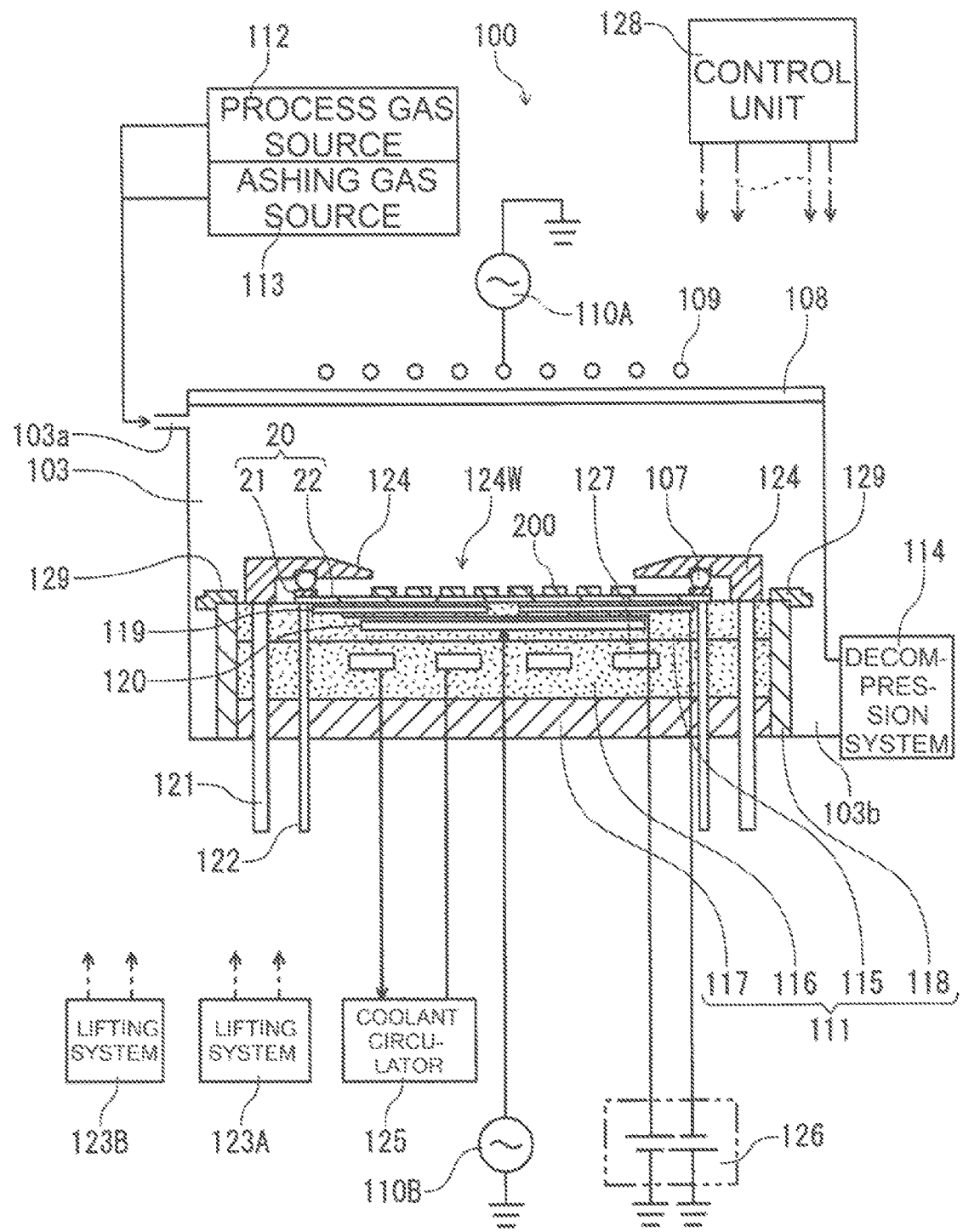
FIG. 15 A schematic cross-sectional diagram illustrating a structure of a plasma processing apparatus used in Embodiments 1 and 2 of the present invention.

In the following, a plasma processing apparatus used in the etching step, the sidewall cleaning step, and the protective film removal step will be specifically described with reference to FIG. 15. It is to be noted, however, that the plasma processing apparatus is not limited thereto. FIG. 15 is a schematic cross-sectional diagram illustrating a structure of a plasma processing apparatus 100. In FIG. 15, a plurality of electronic components (element chips) are held by a conveying carrier.

(Plasma Processing Apparatus)

The plasma processing apparatus 100 includes a stage 111. The conveying carrier 20 holding the electronic components 200 is mounted on the stage 111, with the electronic component 200-holding surface of the holding sheet 22 faced upward. The stage 111 has such a size that the whole conveying carrier 20 can be placed thereon. Above the stage 111, a cover 124 having a window 124W for exposing at least one electronic component 200 therefrom is arranged. The cover 124 is provided with pressing members 107 for pushing the frame 21 downward while the frame 21 is placed on the stage 111. The pressing members 107 are preferably a member that can achieve point contact with the frame 21 (e.g., coil spring, elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical in shape, with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is arranged on the bottom side in the vacuum chamber 103. The stage 111 and the first electrode 109 are facing each other.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting gas from the vacuum chamber 103 to reduce the pressure therein. While the vacuum chamber 103 is supplied with a process gas, a high-frequency power is supplied to the first electrode 109 from the first high-frequency power source 110A. A plasma is thus generated in the vacuum chamber 103.

The stage 111 incorporates a second electrode 120. Specifically, the stage 111 includes an electrode layer 115, a metal layer 116, and a base table 117 supporting the electrode layer 115 and the metal layer 116, each being approximately circular. The stage 111 further includes al 118 surrounding the electrode layer 115, the metal layer 116, and the base table 117. Within the electrode layer 115, there disposed are an electrostatic chuck electrode (hereinafter, ESC electrode 119), and the second electrode 120 electrically connected to a second high-frequency power source 110B. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as mentioned above.

The ESC electrode 119 is electrically connected to a DC power source 126. An electrostatic chuck system is composed of the ESC electrode 119 and the DC power source 126. The electrostatic chuck system pulls the holding sheet 22 onto the stage 111 and secures it thereto. Although a description will be given below of a case where the electrostatic chuck system is used as a fixing system for fixing the holding sheet 22 to the stage 111, this should not be taken as a limitation. A clamp (not shown) may be used for fixing the holding sheet 22 to the stage 111.

The metal layer 116 is formed of, for example, aluminum with anodic oxidation coating. The metal layer 116 contains a coolant channel 127 configured to cool the stage 111. The coolant channel 127 cools the stage 111. As the stage 111 is cooled down, the holding sheet 22 on the stage 111 is cooled down, and the cover 124 partially in contact with the stage 111 is also cooled down. This protects the electronic components 200 and the holding sheet 22 from damage due to heat during plasma processing. A coolant in the coolant channel 127 is circulated by a coolant circulator 125.

The stage 111 is provided near its periphery with a plurality of supports 122 penetrating through the stage 111. The supports 122 support the frame 21 of the conveying carrier 20. The supports 122 are driven to move up and down by a first lifting system 123A. The conveying carrier 20 delivered into the vacuum chamber 103 is passed onto the supports 122 that have been raised to a predetermined position. Then the supports 122 are lowered until their top surfaces become flush with or below the top surface of the stage 111. The conveying carrier 20 is thus placed at a predetermined position on the stage 111.

A plurality of lifting rods 121 are coupled to the cover 124 at its end, so that the cover 124 can be lifted and lowered. The lifting rods 121 are driven to move up and down by the second lifting system 123B. The lifting and lowering operation of the cover 124 by the second lifting system 123B can be controlled independently from the operation by the first lifting system 123A.

Figure 16:
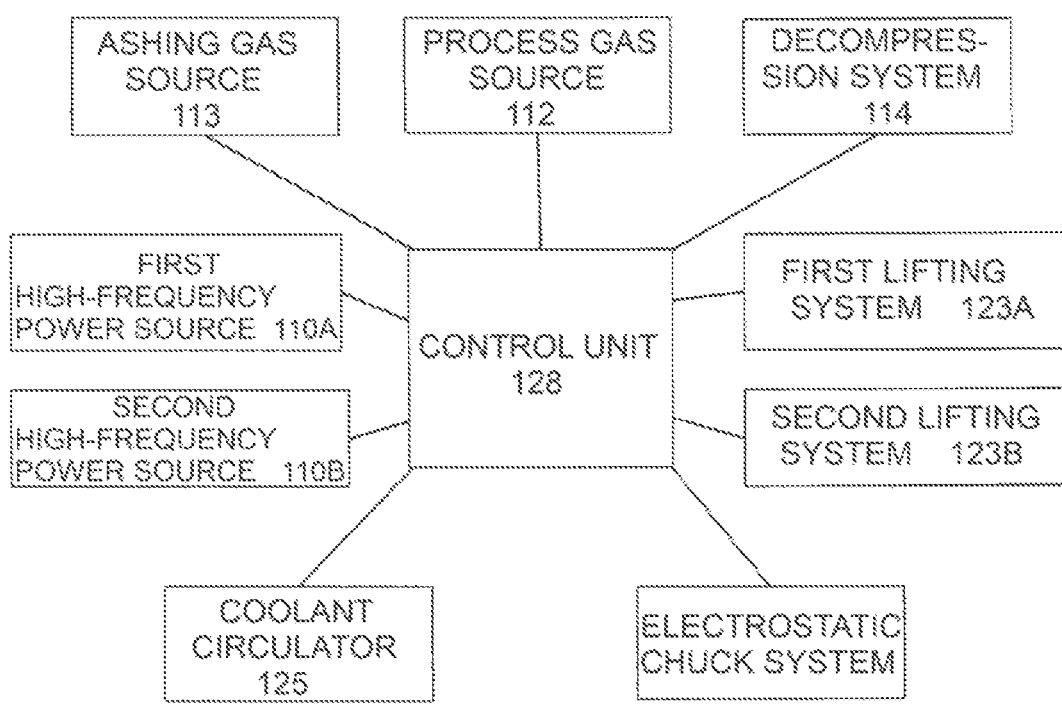
FIG. 16 A block diagram of the plasma processing apparatus used in Embodiments 1 and 2 of the present invention.

A control unit 128 controls the operations of constituent elements of the plasma processing apparatus 100, the elements including the first and second high-frequency power sources 110A and 110B, the process gas source 112, the ashing gas source 113, the decompression system 114, the coolant circulator 125, the first and second lifting systems 123A and 123B, and the electrostatic chuck system. FIG. 16 is a block diagram of the plasma processing apparatus used in the present embodiment.

The plasma processing is applied to the electronic components 200 after the conveying carrier 20 with the electronic components 200 held thereon is delivered into the vacuum chamber, and while the electronic components 200 are loaded on the stage 111.

Prior to the delivering of the conveying carrier 20, within the vacuum chamber 103, the cover 124 is lifted to a predetermined position by means of the lifting rods 121. A gate valve (not shown) opens, and the conveying carrier 20 is delivered into the chamber. A plurality of the supports 122 are on standby at a raised position. When the conveying carrier 20 reaches a predetermined position above the stage 111, the conveying carrier 20 is passed onto the supports 122. The conveying carrier 20 is passed onto the top surface of the supports 122, with the adhesive side of the holding sheet 22 faced upward.

After the conveying carrier 20 is passed onto the supports 122, the vacuum chamber 103 is hermetically closed. Next, the supports 122 start lowering. When the supports 122 are lowered until their top surfaces become flush with or below the top surface of the stage 111, the conveying carrier 20 is placed on the stage 111. Then, the lifting rods 121 is driven to lower the cover 124 to a predetermined position. At this time, the distance between the cover 124 and the stage 111 is adjusted such that the pressing members 107 provided in the cover 124 come in point-contact with the frame 21. In this way, the frame 21 is pushed downward by the pressing members 107, and simultaneously, the frame 21 is covered with the cover 124, and the substrate 10 is exposed from the window 124W.

The cover 124 has, for example, a doughnut-like shape with approximately circular contour, and has a predetermined width and a thin thickness. The diameter of the window 124W is smaller than the inner diameter of the frame 21, and the outer diameter thereof is greater than the outer diameter of the frame 21. Therefore, when the cover 124 is lowered while the conveying carrier 20 is mounted at a predetermined position on the stage 111, the cover 124 can cover the frame 21. From the window 124W, at least one electronic component 200 is exposed.

The cover 124 is formed of, for example, a dielectric, such as ceramics (e.g., alumina, aluminum nitride) or quarts, or a metal, such as aluminum or aluminum with an anodic oxidation coating. The pressing members 107 can be formed of the aforementioned dielectric or metal, or a resin material.

After the conveying carrier 20 is passed onto the supports 122, a voltage is applied to the ESC electrode 119 from the DC power source 126. This brings the holding sheet 22 into contact with the stage 111 as well as to be electrostatically chucked onto the stage 111. The voltage application to the ESC electrode 119 may be initiated after the holding sheet 22 is placed on (or in contact with) the stage 111.

Upon completion of the plasma processing, the gas in the vacuum chamber 103 is evacuated, and the gate valve opens. The conveying carrier 20 holding a plurality of the electronic components 200 is delivered out of the plasma processing apparatus 100 by means of a transfer system having entered through the gate valve. After the conveying carrier 20 is delivered out, the gate valve is immediately closed. The conveying carrier 20 may be delivered out by reversely performing the above-mentioned procedures of mounting the conveying carrier 20 on the stage 111. Specifically, after the cover 124 is lifted to a predetermined position, the voltage supply to the ESC electrode 119 is cut off to release the conveying carrier 20 from the stage 111, and then the supports 122 are raised. After the supports 122 reach a predetermined raised position, the conveying carrier 20 is delivered out.

Embodiment 2

Embodiment 2 of the present invention will be described. In the present embodiment, the sidewall of the electronic component is cleaned by utilizing the difference in the ease of plasma processability between the principal surface and the sidewall of the electronic component. This, as a result, can remove the adhering matter adhering to the sidewall, while allowing the protective film (mask) to continue to exist on the principal surface of the electronic component.

In the sidewall cleaning step of the present embodiment, the electronic component is exposed to a fourth plasma containing a carbon oxide gas. By using the fourth plasma, the adhering matter adhering to a sidewall can be removed, with the protective film covering the principal surface of the electronic component allowed to continue to exist. This is presumably for the following reasons.

The carbon oxide gas included in the process gas dissociates into oxygen atoms and carbon atoms in the plasma processing apparatus. Therefore, the plasma generated in the plasma processing apparatus contains carbon ions and radicals. When carbon ions and radicals collide with the electronic component, carbon (C) derived from the carbon ions and radicals deposits on the surface of the electronic component. In particular, carbon tends to deposit on the principal surface of the electronic component, that is, on the protective film.

Furthermore, the plasma generated in the plasma processing apparatus contains oxygen ions and radicals, too. When oxygen ions and radicals collide with the electronic component, the carbon on the sidewall of the electronic component, together the adhering matter thereon, are oxidized and decomposed, and removed. On the other hand, on the principal surface of the electronic component, the carbon deposited thereon is mainly etched.

Figure 17:
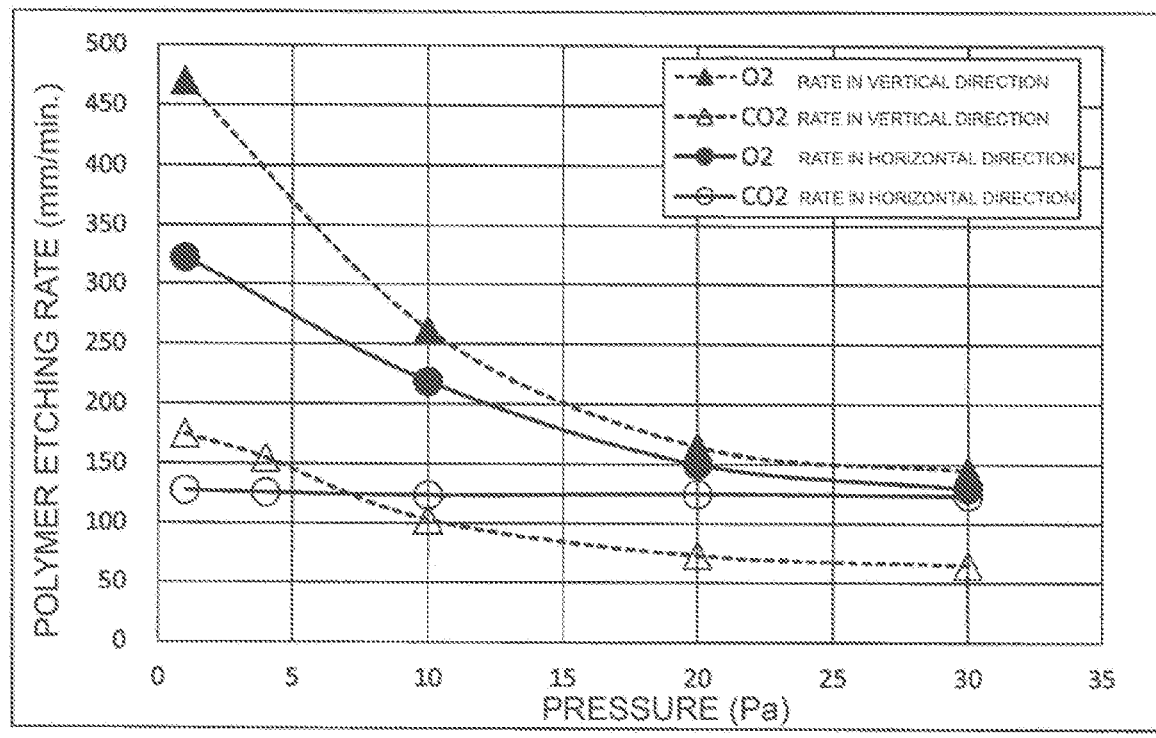
FIG. 17 A graph showing a relationship between the polymer etching rate in the vertical direction and the horizontal direction and the pressure in the vacuum chamber.
Figure 18:
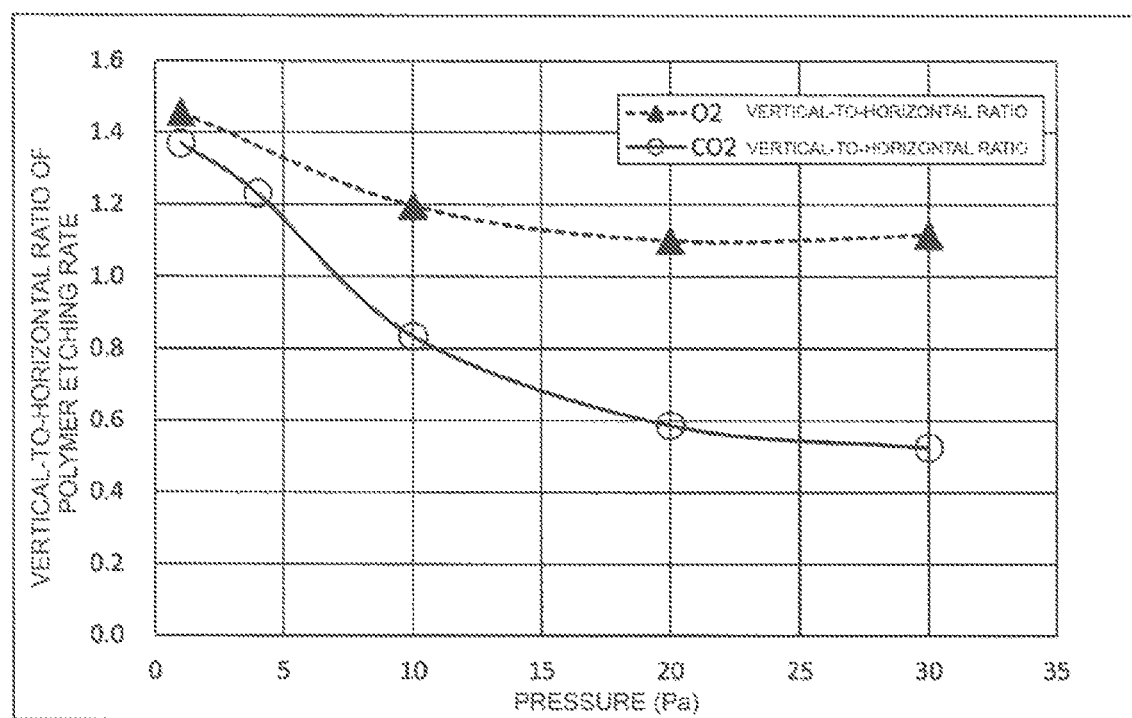
FIG. 18 A graph showing a relationship between the ratio of the polymer etching rate in the vertical direction and the horizontal direction and the pressure in the vacuum chamber.

Data shows the effect of the fourth plasma, that is, the adhering matter adhering to a sidewall can be removed, with the protective film covering the principal surface of the electronic component allowed to continue to exist. FIG. 17 is a graph showing a relationship between the polymer etching rate in the vertical direction and the horizontal direction and the pressure in the processing (vacuum) chamber. FIG. 18 is a graph showing a relationship between the ratio of the polymer etching rate in the vertical direction to that in the horizontal direction (Etching rate in vertical direction/Etching rate in horizontal direction, hereinafter, a vertical-to-horizontal ratio) and the pressure in the vacuum chamber. In FIGS. 17 and 18, for comparison, data obtained when oxygen (02) gas is used as the process gas are also shown. The polymer etching rate in the vertical direction means the rate at which the polymer deposited on the principal surface of the electronic component is etched. The polymer etching rate in the horizontal direction means the rate at which the polymer deposited on the sidewall of the electronic component is etched.

As a sample, a silicon substrate with a polymer (fluorocarbon) deposited thereon was used. The conditions for forming the polymer were as follows. $C_4F_8$ was supplied at 600 sccm into the vacuum chamber, with the pressure in the vacuum chamber set to 10 Pa, the high-frequency power applied to the electrode (first electrode) disposed facing the stage on which the sample was placed set to 4800 W, the high-frequency power applied to the electrode (second electrode) incorporated in the stage disposed facing the stage on which the sample was placed set to 0 W, and the stage temperature set to −10° C. The processing time was set to 2 minutes.

The conditions for etching the polymer were as follows. $CO_2$ was supplied at 200 sccm as a process gas into the vacuum chamber, with the pressure in the vacuum chamber adjusted to 30 Pa or less, the high-frequency power applied to the first electrode set to 3000 W, the high-frequency power applied to the second electrode set to 0 W, and the stage temperature set to −10° C. The processing time was set to 1 minute. Polymer etching using oxygen ($O_2$) gas was also performed under the similar conditions.

As shown in FIG. 17, the etching rate in the vertical direction in the polymer etching using $CO_2$ is sufficiently smaller than that using $O_2$. This is presumably because, as described above, the carbon dissociated from $CO_2$ has deposited on the principal surface of the electronic component during etching. Due to the deposition of carbon on the principal surface simultaneously with etching, the apparent vertical etching rate decreases. As a result, the protective film covering the principal surface of the electronic component can be allowed to continue to exist. On the other hand, in polymer etching using $O_2$, since no carbon deposits, the protective film on the surface of the electronic component is etched.

As shown in FIG. 17, the etching rate in the longitudinal direction in polymer etching decreases with increase of the pressure in the chamber, both when using $CO_2$ and when using $O_2$. When using $O_2$, the etching rate in the horizontal direction also decreases with increase of the pressure in the chamber. On the other hand, as understood from FIG. 17, when using $CO_2$, the etching rate in the horizontal direction is hardly affected by the pressure in the chamber.

As shown in FIG. 18, the vertical-to-horizontal ratio decreases with increase of the pressure, both when using $CO_2$ and when using $O_2$. When using $CO_2$, the vertical-to-horizontal ratio decreases to 1 or less in the region where the pressure is about 7 Pa or more. That is, when using $CO_2$, etching in the horizontal direction is more likely to proceed than in the vertical direction. Therefore, the above effect can be obtained. When using $O_2$, the vertical-to-horizontal ratio exceeds 1 in the region where the pressure is up to 30 Pa.

That is, by the above sidewall cleaning step, the adhering matter is removed on the surface of the sidewall, while the etching of the protective film itself is suppressed on the first surface. In this way, it is possible to clean the sidewall of the electronic component, while suppressing the damage on the first surface due to the sidewall cleaning step.

The cleaning method according to the present embodiment is particularly suitable for cleaning the sidewall of the electronic component having been subjected to the Bosch process. The Bosch process alternates between a first step of forming a recessed portion corresponding to a dicing region by plasma processing, and a second step of depositing a second film by plasma processing on the inner wall of the recessed portion. Therefore, a deposited film, and a product of reaction between the deposited film and the plasma and the like (adhering matter) tend to adhere to a sidewall of the formed element chips. Moreover, roughness called scallops is formed on the sidewall. The adhering matter on the scallops is difficult to remove. According to the cleaning method according to the present embodiment, such adhering matter can be removed by a convenient and simple method. The present embodiment encompasses an element chip manufacturing method including an etching step using the Bosch process.

The sidewall cleaning step will be described in detail below.

The sidewall cleaning step is performed by exposing the electronic component to a fourth plasma. The fourth plasma is generated from a process gas including a carbon oxide gas.

On a sidewall of the electronic component, for example, an adhering matter including a film (deposited film) deposited by the Bosch process and a product of reaction between the deposited film and the plasma is adhering. Such an adhering matter is manly composed of a polymer (fluorocarbon) containing carbon atoms and fluorine atoms, and further contains silicon and oxygen. The fluorine atoms contained in the polymer have high mobility and can be a cause of deterioration in the reliability of the device. The polymer can be easily removed by oxygen ions and radicals.

The fourth plasma is generated from a process gas including a carbon oxide gas (fourth process gas). The carbon oxide gas tends to dissociate into oxygen atoms and carbon atoms in the plasma processing apparatus. Therefore, carbon ions and radicals tend to be generated, and the above polymer can be quickly removed. On the other hand, the dissociated carbon atoms tend to adhere to the protective film.

Table 1 shows the measurement results of concentrations of impurities (C, O, F, Si, metal elements) on the surface of an electronic component before and after the sidewall cleaning step. The electronic component was a 200 µm-thick silicon chip having a polyimide layer at its surface and a metal electrode (Au electrode) at an opening of the polyimide layer. The concentration was measured by X-ray photoelectron spectroscopy on the metal electrode at the chip surface and on the sidewall of the chip. The cleaning conditions were as follows. $CO_2$ was supplied as a process gas at 200 sccm into the vacuum chamber, with the pressure in the vacuum chamber set to 1 Pa, the high-frequency power applied to the first electrode set to 3000 W, and the high-frequency power applied to the second electrode set to 0 W. The processing time was set to 5 minutes.

Table 1 also shows, for comparison, data obtained when using oxygen (02) gas as the process gas. The cleaning conditions were the same as above, except that the process gas was changed from $CO_2$ to $O_2$. By the cleaning under the conditions above, the polyimide layer was etched by 0.9 µm when $CO_2$ was used, and the polyimide layer was etched by 2.5 µm when 02 was used.

As shown in Table 1, when $CO_2$ was used, the fluorine concentrations on the metal electrode surface and the sidewall were reduced to 1.4 atm % and 1.5 atm %, respectively. On the other hand, when $O_2$ was used, the fluorine concentrations on the metal electrode surface and sidewall were also reduced, but were still 3.5 atm % and 3.65 atm %, respectively. That is, when $CO_2$ is used, the etching of the polyimide layer is suppressed on the principal surface side of the electronic component, while the fluorine atoms are efficiently removed. When $CO_2$ is used, the fluorine removal effect on the sidewall of the electronic component is also excellent.

TABLE 1

| Place of measurement | Concentration (atm %) | Before cleaning (atm %) | After cleaning with $CO_2$ (atm %) | After cleaning with $O_2$ (atm %) |
| --- | --- | --- | --- | --- |
| Metal electrode (Chip top surface) | C | 48.1 | 54.4 | 56.8 |
| | O | 13.7 | 25.6 | 23.4 |
| | F | 26.7 | 1.4 | 3.5 |
| | Si | 1.8 | 5.1 | 4.8 |
| | Metal atoms | 9.8 | 13.5 | 11.5 |
| Sidewall (Chip side surface) | C | 34.5 | 30.1 | 43.2 |
| | O | 20.3 | 34.2 | 28.0 |
| | F | 28.3 | 1.5 | 3.65 |
| | Si | 17.0 | 34.2 | 25.2 |

Carbon oxide is a compound of carbon and oxygen, and is represented by, for example, $C_xO_y$, where x=1 to 5 and y=1, 2. Specific examples thereof include carbon monoxide (CO), oxygen dioxide ($CO_2$), tricarbon dioxide, pentacarbon dioxide, and carbonyl sulfide (COS). These may be used singly or in combination of two or more kinds. The carbon oxide gas may be CO or $CO_2$, because they are easily available.

The fourth process gas may contain another gas, such as Ar, $H_2$, $N_2$, and He. The proportion of the carbon oxide gas occupying the fourth process gas may be 10 vol % or more and less than 100 vol %, and may be 30 vol % or more and 98 vol % or less.

The conditions for generating the fourth plasma are appropriately set according to the amount of the adhering matter and the like. The conditions for generating the fourth plasma are, for example, as follows. $CO_2$ is supplied as a process gas at 50 sccm or more and 400 sccm or less into the vacuum chamber. The pressure in the vacuum chamber is 0.6 Pa or more and 30 Pa or less, the high-frequency power applied to the first electrode is 500 W or more and 5000 W or less, and the high-frequency power applied to the second electrode is 0 W or more and 100 W or less. The stage temperature is −20° C. or higher and 40° C. or lower. The pressure in the vacuum chamber is preferably 5 Pa or more, more preferably 7 Pa or more.

According to the above conditions, the effective etching rate of the protective film on the surface of the electronic component becomes about 50 nm/min or more and about 200 nm/or less, and the effective etching rate of the adhering matter on the side surfaces of the electronic component becomes 100 nm/min or more and 130 nm/min or less. The processing time may be set in consideration of the thickness of the protective film and the thickness of the adhering matter. The processing time is, for example, 60 seconds or more and 300 seconds or less.

In the sidewall cleaning step, a plurality of the electronic components may be processed at the same time. This improves the productivity. In this case, a distance W between the sidewalls facing each other of any two adjacent electronic components and a height H of the sidewall of one of the two of the electronic components may satisfy H≥5W. Even with such high-aspect-ratio gaps, according to the present embodiment, the adhering matter adhering to the sidewall can be removed, with the protective film covering the principal surface of the electronic components allowed to continue to exist. The distance W and the height H may satisfy H≤50W.

The height H of the sidewall is not limited. The height H of the sidewall is, for example, 20 μm or more and 700 μm or less. The distance W between the sidewalls also is not limited. The distance W between the sidewalls is, for example, 4 μm or more and 60 μm or less.

The distance W is an average of the shortest distances measured at any two points between the first-surface-side ends of the sidewalls facing each other of any two adjacent electronic components. When the sidewalls are not entirely facing each other, the shortest distance is measured at the portions where the sidewalls face each other. The height H of the sidewall is the lower of two averages each determined by measuring the height at any two points of each of the two sidewalls (or the portions thereof) used for determining the distance W. The height of the sidewall is a shortest distance between the first and second surfaces continuing from the sidewall.

The present embodiment will be specifically described below with reference to the drawings, with an electronic component having a semiconductor layer and a wiring layer taken as an example. The present embodiment, however, is not limited thereto.

Figure 19:
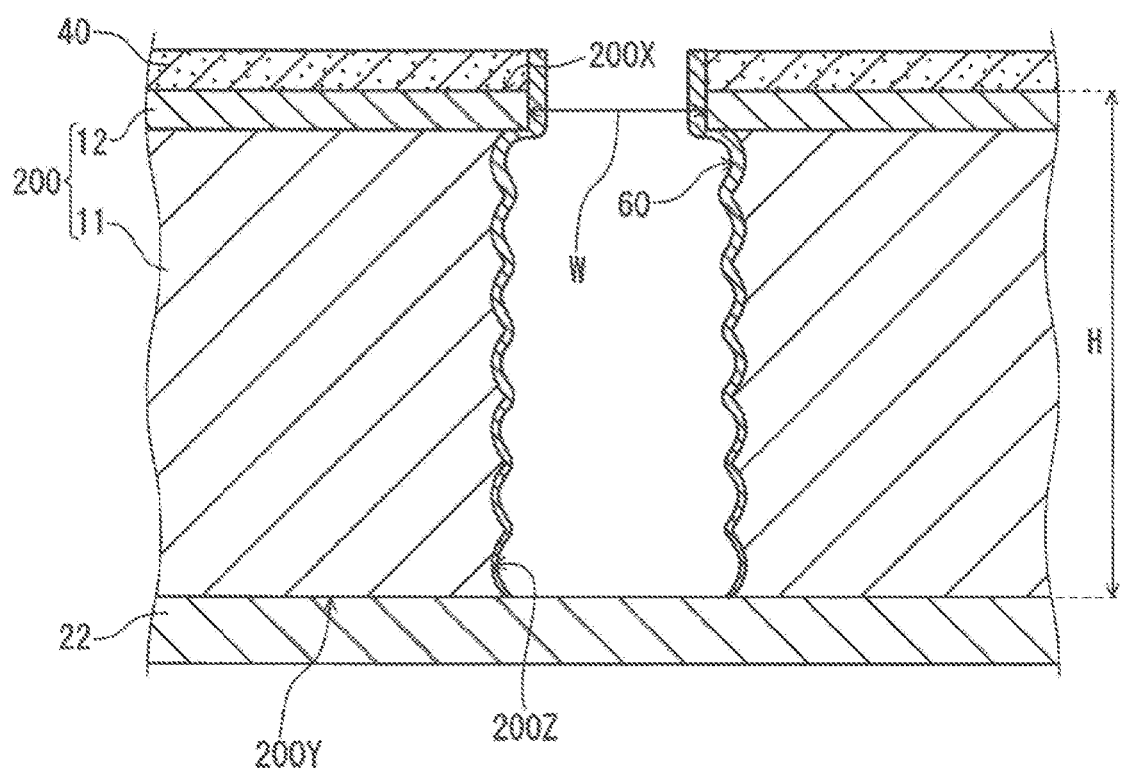
FIG. 19 A schematic cross-sectional view of an essential part of electronic components subjected to a sidewall cleaning step according to Embodiment 2 of the present invention.

FIG. 19 is a schematic cross-sectional view of an essential part of electronic components subjected to the sidewall cleaning step. A plurality of electronic components 200 are supported by a holding sheet 22 described later. The holding sheet 22 is used for improving the ease of handling, and may not be necessarily used.

The electronic components 200 each include a semiconductor layer 11 and a wiring layer 12 disposed on the semiconductor layer 11 on a first surface 200X side. The first surface 200X is covered with a protective film 40. Scallops are formed on a sidewall 200Z of the electronic components 200. An adhering matter 60 is adhering to the sidewall 200Z. In the illustrated example, the scallops and the adhering matter are exaggerated.

Figure 20:
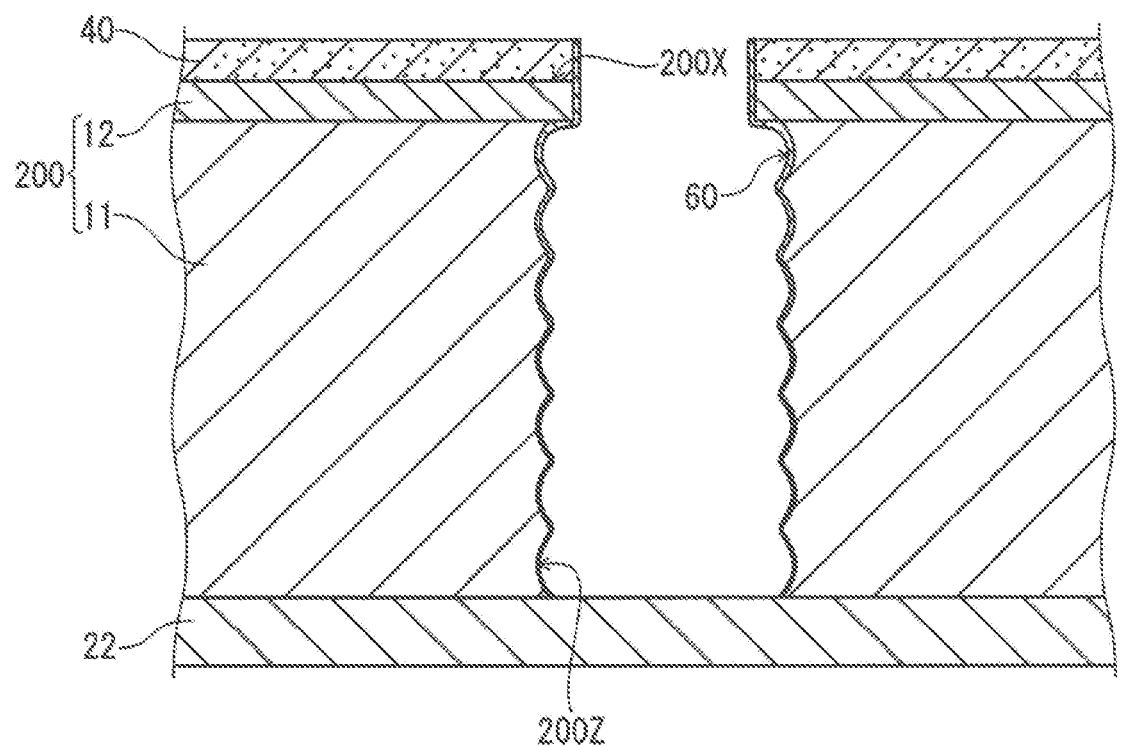
FIG. 20 A schematic cross-sectional view of an essential part of the electronic components during the sidewall cleaning step according to Embodiment 2 of the present invention.

FIG. 20 is a schematic cross-sectional view of an essential part of the electronic components during the sidewall cleaning step. While no significant decrease is observed in the thickness of the protective film 40, on the sidewall 200Z, the adhering matter 60 is partially removed, and the layer of the adhering matter 60 is thinned.

Figure 21:
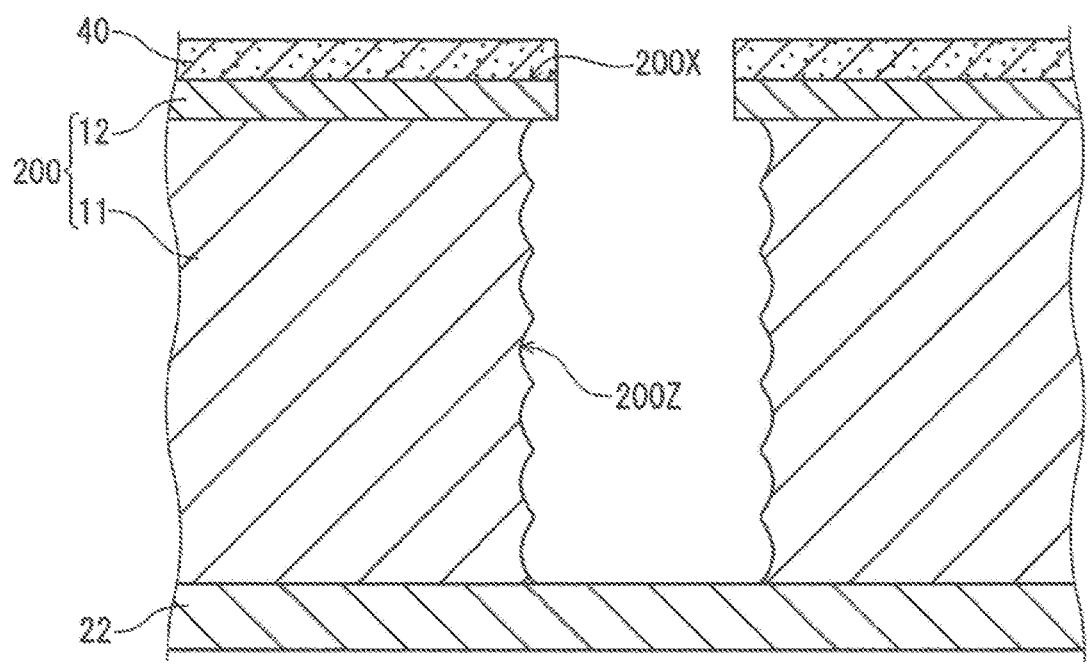
FIG. 21 A schematic cross-sectional view of an essential part of the electronic components after the sidewall cleaning step according to Embodiment 2 of the present invention.

FIG. 21 is a schematic cross-sectional view of an essential part of the electronic components after the sidewall cleaning step. While the protective film 40 is allowed to exist, on the sidewall 200Z, the residual portion of the adhering matter 60 is removed, exposing the sidewall 200Z.

Next, a cleaning method including the above sidewall cleaning step will be described.

A. Electronic Component Cleaning Method

Figure 22:
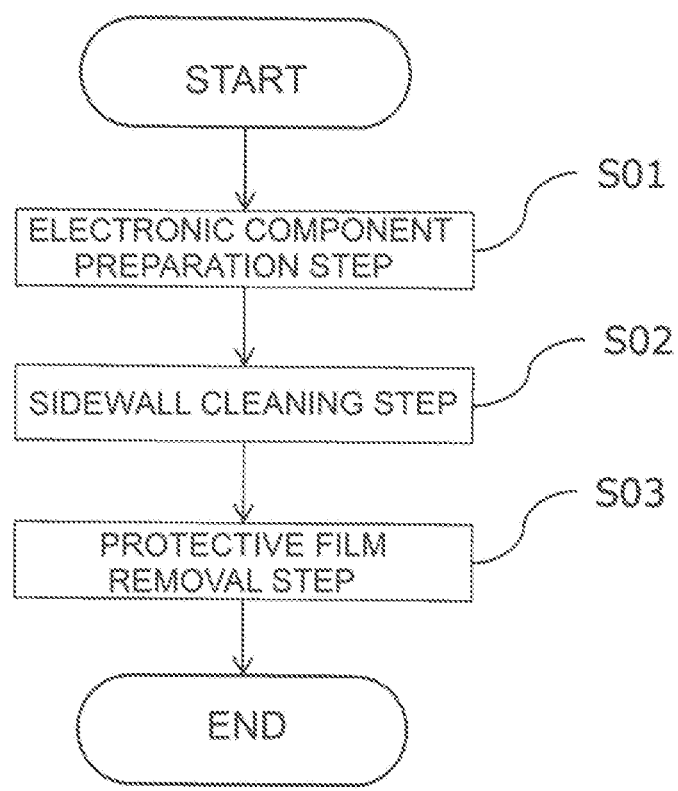
FIG. 22 A flowchart of an electronic component cleaning method according to Embodiment 2 of the present invention.

An electronic component cleaning method according to the present embodiment includes: a preparation step of preparing an electronic component having a first surface covered with a protective film, a second surface opposite to the first surface, a sidewall between the first surface and the second surface, and an adhering matter adhering to the sidewall; and a sidewall cleaning step of cleaning the sidewall of the electronic component. FIG. 22 is a flowchart of an electronic component cleaning method according to the present embodiment.

(i) Electronic Component Preparation Step (S01)

At least one electronic component having a first surface covered with a protective film, a second surface opposite to the first surface, and a sidewall between the first surface and the second surface is prepared. The electronic component is, for example, an element chip produced by plasma-dicing a substrate using the Bosch process. Scallops, or roughness, may be formed on the sidewall.

The electronic component may be, for example, the same as that in Embodiment 1.

When a plurality of the electronic components are processed simultaneously in the sidewall cleaning step, for ease of handling, the electronic components are preferably attached to a holding sheet secured to a frame. A member including a frame and a holding sheet secured to the frame is referred to as a conveying carrier.

(Conveying Carrier)

The conveying carrier may be, for example, the same as that in Embodiment 1.

The above electronic component preparation step includes: a substrate preparation step of preparing a substrate including a plurality of element regions and a dicing region defining the element regions, and having a first surface and a second surface opposite to the first surface; a protective film formation step of forming a protective film on the first surface; an aperture formation step of forming an aperture in the protective film, to expose the dicing region in the first surface; and an etching step of repeating cycles, each cycle including a first step of forming a recessed portion corresponding to the exposed dicing region by plasma processing, and a second step of depositing a second film by plasma processing, on an inner wall of the recessed portion. These steps will be described later. In this way, a plurality of electronic components arranged at predetermined intervals are prepared.

FIG. 7A is a schematic top view of electronic components prepared in an electronic component preparing step. FIG. 7B is a cross-sectional view taken along line A-A in FIG. 7A. In FIG. 7B, the adhering matter is not shown for illustrative convenience.

A conveying carrier 20 includes a frame 21 and a holding sheet 22 secured to the frame 21. The frame 21 may be provided with a notch 21a and a corner cut 21b for correct positioning. The holding sheet 22 has an adhesive side 22X and a non-adhesive side 22Y, and the adhesive side 22X is attached at its periphery to one side of the frame 21. On a portion of the adhesive side 22X exposed from the opening of the frame 21, second surfaces 200Y of the electronic components 200 are attached (see FIG. 19 etc.).

A plurality of the electronic components 200 are attached, with a space therebetween, onto the adhesive side 22X of the holding sheet 22. Such a plurality of the electronic components 200 can be obtained by plasma-dicing a substrate using the Bosch process. The electronic components 200 each include a semiconductor layer 11 and a wiring layer 12 disposed on the semiconductor layer 11 on a first surface 200X side. A protective film 40 is formed on the first surface 200X of the electronic components 200.

(ii) Sidewall Cleaning Step (S02)

The sidewall of the element chips is cleaned.

The sidewall cleaning step is implemented by, as described above, exposing the electronic component to the fourth plasma generated from a process gas including a carbon oxide gas. According to the above sidewall cleaning step, the adhering matter on the sidewall can be removed, with the protective film allowed to continue to exist.

(iii) Protective Film Removal Step (S03)

After the final removal step, the protective film may be removed.

For the removal of the protective film, for example, a third plasma generated from a third process gas including oxygen gas ($O_2$) is used. The third process gas may include 02 and a fluorine-containing gas. Examples of the fluorine-containing gas include similar compounds to those as mentioned above. The proportion of $O_2$ occupying the third process gas may be 10 vol % or more and less than 100 vol %, and may be 30 vol % or more and 98 vol % or less.

The conditions for generating the third plasma may be the same as those in Embodiment 1.

When the protective film is water-soluble, the protective film may be removed by washing with water, instead of using the third plasma. When the protective film is an insulating film (e.g., silicon nitride, silicon oxide film) and/or a resin layer (polyimide) arranged on the outermost surface of the electronic component, the protective film may not be removed because this protective film is for protecting the electronic component during production as well as after distribution.

B. Element Chip Manufacturing Method

An element chip manufacturing method according to the present embodiment includes: a substrate preparation step of preparing a substrate including a plurality of element regions and a dicing region defining the element regions, and having a first surface and a second surface opposite to the first surface; a protective film formation step of forming a protective film on the first surface; an aperture formation step of forming an aperture in the protective film, to expose the dicing region in the first surface; an etching step of repeating cycles, each cycle including a first step of forming a recessed portion corresponding to the exposed dicing region by plasma processing, and a second step of depositing a second film by plasma processing, on an inner wall of the recessed portion, to obtain an electronic component having the first surface covered with the protective film, the second surface, a sidewall between the first surface and the second surface, and an adhering matter adhering to the sidewall; and a sidewall cleaning step of cleaning the sidewall of the electronic component.

Figure 23:
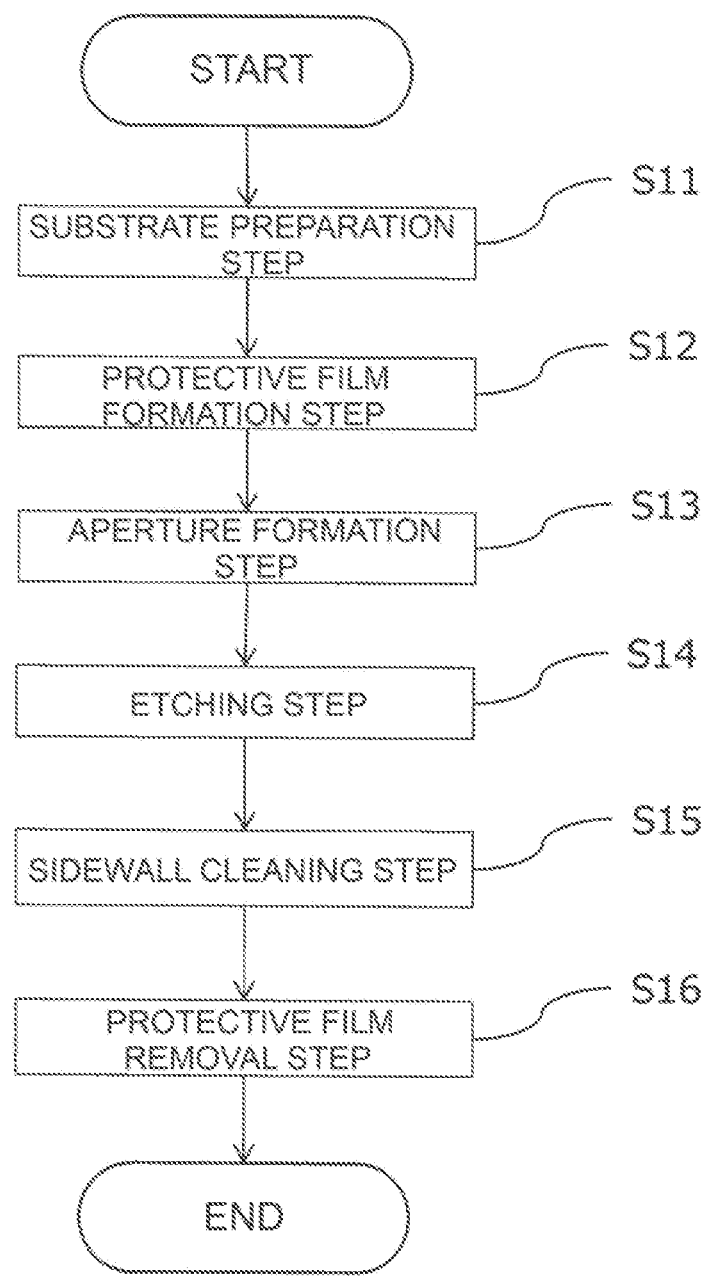
FIG. 23 A flowchart of an element chip manufacturing method according to Embodiment 2 of the present invention.

The sidewall cleaning step is performed by exposing the electronic component to a fourth plasma generated from a process gas including a carbon oxide gas. FIG. 23 is a flowchart of an element chip manufacturing method according to the present embodiment.

(1) Substrate Preparation Step (S11)

First, a substrate, which is an object to be processed, is prepared.

(Substrate)

The substrate may be the same as used in Embodiment 1.

The second surface of the substrate may be attached to the holding sheet secured to the frame. This improves the ease of handling. By dicing the substrate attached to the holding sheet, a plurality of element chips arranged at intervals on the holding sheet can be obtained. The shapes, materials, etc. of the frame and holding sheet are as described above.

(2) Protective Film Formation Step (S12)

A protective film covering the first surface of the substrate is formed.

The protective film is provided for protecting the element regions of the substrate from plasma and the like. After the etching step, the protective film is removed. The material and thickness of the protective film are as described above.

The protective film may be formed, for example, in the same manner as in Embodiment 1.

(3) Aperture Formation Step (S13)

Apertures are formed in the protective film, to expose the dicing regions of the substrate.

The apertures may be formed, for example, in the same manner as in Embodiment 1.

(4) Etching Step (S14)

The substrate is exposed to a plasma, so that the dicing regions exposed from the apertures are etched to the second surface, thereby to form a plurality of element chips from the substrate. The element chips thus obtained are held by the holding sheet.

The etching step may be formed, for example, in the same manner as in Embodiment 1.

(5) Sidewall Cleaning Step (S15)

The sidewall of the obtained electronic components is cleaned.

The sidewall cleaning step is implemented by the sidewall cleaning step (ii) in the above electronic component cleaning method. According to the sidewall cleaning step of the present embodiment, the adhering matter on a sidewall can be removed, with the protective film allowed to continue to exist.

The etching step and the sidewall cleaning step may be performed in the same or different plasma processing apparatus. When performed in the same plasma processing apparatus, these steps may be performed successively.

(6) Protective Film Removal Step (S16)

The protective film removal step is implemented by the protective film removal step (iii) in the above electronic component cleaning method. By this step, the protective film is removed.

The sidewall cleaning step and the protective film removal step may be performed in the same or different plasma processing apparatus. When performed in the same plasma processing apparatus, these steps may be performed successively.

After the protective film removal step, the element chips are detached from the holding sheet.

The element chips are, for example, thrust upward together with the holding sheet with thrust-up pins from the non-adhesive side of the holding sheet. This allows at least part of the element chip to float from the holding sheet. The element chips are then detached from the holding sheet by a pickup device.

A detailed description will be given below of the manufacturing method of element chips, with reference to the drawings. It is to be noted, however, the present embodiments are not limited thereto.

FIG. 9 is a schematic top view of a substrate prepared in the substrate preparing step according to the present embodiment. FIG. 10 is a schematic partial cross-sectional view of the substrate. A substrate 10 has a first surface 10X and a second surface 10Y, and includes a plurality of element regions 101 and dicing regions 102 defining the element regions 101. The element regions 101 each include a semiconductor layer 11 and a wiring layer 12 disposed on the semiconductor layer 11 on the first surface 10X side. The dicing regions 102 each include the semiconductor layer 11 and an electrically insulating film 14. The second surface 10Y of the substrate 10 is attached to the holding sheet 22 included in the conveying carrier 20.

FIG. 11 is a schematic partial cross-sectional view of the substrate after the protective film formation step according to the present embodiment. The protective film 40 is formed on the first surface 10X of the substrate 10.

FIG. 12 is a schematic partial cross-sectional view of the substrate after the aperture formation step according to the present embodiment. The protective film 40 and the insulating film 14 in the dicing regions 102 are removed, and the semiconductor layer 11 is exposed from the apertures in the dicing regions 102.

FIG. 13 is a schematic partial cross-sectional view of element chips produced in the etching step according to the present embodiment. The substrate is etched along the dicing regions, and a plurality of element chips 200 are formed from the substrate. Scallops are formed on the sidewall 200Z of the electronic components. The first surface 200X of the element chips 200 is covered with the protective film 40.

FIG. 14 is a schematic partial cross-sectional view of the element chips after the protective film removal step according to the present embodiment. The protective film 40 covering the first surface 200X are removed.

A plasma processing apparatus used in the etching step, the sidewall cleaning step, and the protective film removal step may be the same as used in Embodiment 1. FIG. 15 is a schematic cross-sectional diagram illustrating a structure of a plasma processing apparatus 100. FIG. 16 is a block diagram of the plasma processing apparatus used in the present embodiment.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

According to the cleaning method of the present invention, the sidewall can be cleaned while suppressing the damage on the electronic component. The method is therefore particularly suitable as a post-treatment of the element chips manufactured by plasma dicing using the Bosch process.

REFERENCE SIGNS LIST

200: electronic component (element chip)
200X: first surface
200Y: second surface
200Z: sidewall
10: substrate
10X: first surface
10Y: second surface
11: semiconductor layer
12: wiring layer
14: insulating film
20: conveying carrier
21: frame
21a: notch
21b: corner cut
22: holding sheet
22X: adhesive side
22Y: non-adhesive side
40: protective film
50: first film
60: adhering matter
100: plasma processing apparatus
103: vacuum chamber
103b: gas outlet
108: dielectric member
109: first electrode
110A: first high-frequency power source 110B: second high-frequency power source
111: stage
112: process gas source
113: ashing gas source
114: decompression system
115: electrode layer
116: metal layer
117: base table
118: peripheral member
119: ESC electrode
120: second electrode
121: lifting rod
122: support
123A, 123B: lifting system
124: cover
124W: window
125: coolant circulator
126: DC power source
127: coolant channel
128: control unit
129: circumferential ring

What is claimed is:

1. An electronic component cleaning method, comprising:
   a preparation step of preparing an electronic component having a first surface covered with a protective film, a second surface opposite to the first surface, a sidewall between the first surface and the second surface, and an adhering matter adhering to the sidewall; and
   a sidewall cleaning step of cleaning the sidewall of the electronic component, wherein
   the sidewall cleaning step includes
   a deposition step of depositing a first film on a surface of the protective film and a surface of the adhering matter, using a first plasma, and
   a removal step of removing the first film deposited on the surface of the adhering matter, together with at least part of the adhering matter, using a second plasma, and
   in the sidewall cleaning step, the deposition step and the removal step are alternately repeated a plurality of times, so as to allow the protective film to continue to exist,
   the sidewall cleaning step is performed so as to satisfy RR2/RR1>RD2/RD1, where
   the RD2/RD1 is a ratio of a deposition rate RD2 at which the first film is allowed to deposit on a surface of the sidewall to a deposition rate RD1 at which the first film is allowed to deposit on the surface of the protective film, in the deposition step, and
   the RR2/RR1 is a ratio of a removal rate RR2 at which the first film attached to the sidewall is removed to a removal rate RR1 at which the first film on the surface of the protective film is removed, in the removal step.

2. The electronic component cleaning method according to claim 1, wherein
   the sidewall cleaning step is performed in a processing chamber of a plasma processing apparatus, and
   a pressure PD1 of the processing chamber in the deposition step and
   a pressure PR1 of the processing chamber in the removal step satisfy
   PD1<PR1.

3. The electronic component cleaning method according to claim 1, wherein
   the sidewall cleaning step is performed using a plasma processing apparatus including a stage on which the electronic component is placed, a first electrode disposed facing the stage, and a second electrode incorporated in the stage, and
   a high-frequency power PD2 applied to the second electrode in the deposition step and
   a high frequency power PR2 applied to the second electrode in the removal step satisfy
   PD2≤PR2.

4. The electronic component cleaning method according to claim 1, wherein
   in the sidewall cleaning step, a plurality of the electronic components are processed, and
   a distance W between the sidewalls facing each other of any two of the electronic components and a height H of the sidewall of one of the two of the electronic components satisfy
   H≥5 W.

5. The electronic component cleaning method according to claim 1, wherein
   the preparation step of preparing an electronic component includes:
   a substrate preparation step of preparing a substrate including a plurality of element regions and a dicing region defining the element regions, and having the first surface and the second surface;
   a protective film formation step of forming the protective film on the first surface;
   an aperture formation step of forming an aperture in the protective film, to expose the dicing region in the first surface; and
   an etching step of repeating cycles, each cycle including a first step of forming a recessed portion corresponding to the exposed dicing region by plasma processing, and a second step of depositing a second film by plasma processing, on an inner wall of the recessed portion.

6. The electronic component cleaning method according to claim 1, wherein the removal step performed last is followed by a protective film removal step of removing the protective film.

7. The electronic component cleaning method according to claim 1, wherein the first plasma is generated from a process gas containing carbon atoms.

8. The electronic component cleaning method according to claim 1, wherein the second plasma is generated from a process gas containing oxygen atoms.

9. An element chip manufacturing method, comprising:
   a substrate preparation step of preparing a substrate including a plurality of element regions and a dicing region defining the element regions, and having a first surface and a second surface opposite to the first surface;
   a protective film formation step of forming a protective film on the first surface;
   an aperture formation step of forming an aperture in the protective film, to expose the dicing region in the first surface;
   an etching step of repeating cycles, each cycle including a first step of forming a recessed portion corresponding to the exposed dicing region by plasma processing, and a second step of depositing a second film by plasma processing, on an inner wall of the recessed portion, to obtain an electronic component having the first surface covered with the protective film, the second surface, a sidewall between the first surface and the second surface, and an adhering matter adhering to the sidewall; and a sidewall cleaning step of cleaning the sidewall of the electronic component, wherein the sidewall cleaning step includes a deposition step of depositing a first film on a surface of the protective film and a surface of the adhering matter, using a first plasma, and a removal step of removing the first film deposited on the surface of the adhering matter, together with at least part of the adhering matter, using a second plasma, and in the sidewall cleaning step, the deposition step and the removal step are alternately repeated a plurality of times, so as to allow the protective film to continue to exist, the sidewall cleaning step is performed so as to satisfy RR2/RR1>RD2/RD1, where the RD2/RD1 is a ratio of a deposition rate RD2 at which the first film is allowed to deposit on a surface of the sidewall to a deposition rate RD1 at which the first film is allowed to deposit on the surface of the protective film, in the deposition step, and the RR2/RR1 is a ratio of a removal rate RR2 at which the first film attached to the sidewall is removed to a removal rate RR1 at which the first film on the surface of the protective film is removed, in the removal step.

* * * * *